(12) United States Patent
Ichiguchi et al.

(10) Patent No.: US 6,724,223 B2
(45) Date of Patent: Apr. 20, 2004

(54) SEMICONDUCTOR DEVICE USED IN TWO SYSTEMS HAVING DIFFERENT POWER SUPPLY VOLTAGES

(75) Inventors: Tetsuichiro Ichiguchi, Hyogo (JP); Tsutomu Nagasawa, Hyogo (JP); Tadaaki Yamauchi, Hyogo (JP); Zengcheng Tian, Hyogo (JP); Makoto Suwa, Hyogo (JP); Junko Matsumoto, Hyogo (JP); Takeo Okamoto, Hyogo (JP); Hideki Yonetani, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/287,643

(22) Filed: Nov. 5, 2002

(65) Prior Publication Data

US 2003/0213972 A1 Nov. 20, 2003

(30) Foreign Application Priority Data

May 17, 2002 (JP) ........................................ 2002-143317

(51) Int. Cl.[7] .......................................... H03K 19/0175
(52) U.S. Cl. .............................. 326/81; 326/80; 326/62; 326/63; 327/333
(58) Field of Search .............................. 326/62, 63, 68, 326/70, 71, 80, 81; 327/333, 541, 543, 387; 365/189.05, 189.11

(56) References Cited

U.S. PATENT DOCUMENTS

| 6,107,832 A | * | 8/2000 | Taniguchi | ........... | 326/81 |
| 6,278,294 B1 | * | 8/2001 | Taniguchi | ........... | 326/80 |
| 6,333,663 B1 | * | 12/2001 | Lee | ........... | 327/333 |

* cited by examiner

*Primary Examiner*—Vibol Tan
(74) *Attorney, Agent, or Firm*—McDermott, Will & Emery

(57) ABSTRACT

A clock buffer of a DRAM includes: a first NAND gate which is driven by a first internal power supply voltage (2.5 V) and which determines the level of an input clock signal if the DRAM is used for a TTL-system interface (MLV=2.5 V); and a second NAND gate which is driven by a second internal power supply voltage (1.8 V) and which determines the level of the input clock signal if the DRAM is used for a 1.8 V-system interface (MLV=0 V). Accordingly, in each of the first and second NAND gates, sizes of four MOS transistors can be set at optimum values, respectively.

16 Claims, 22 Drawing Sheets

FIG.27 PRIOR ART
|  | TTL-SYSTEM INTERFACE | 1.8 V-SYSTEM INTERFACE |
|---|---|---|
| VDD | 3.3V | 2.5V |
| VDDQ | 3.3V | 1.8V |
| VIH min | 2.0V | 1.44V(0.8VDDQ) |
| VIL max | 0.8V | 0.36V(0.2VDDQ) |
FIG.28 PRIOR ART
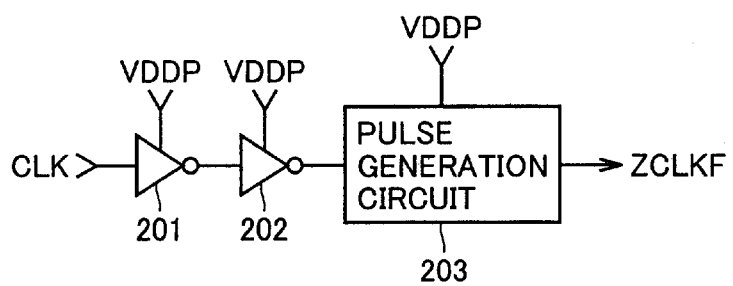
FIG.29 PRIOR ART
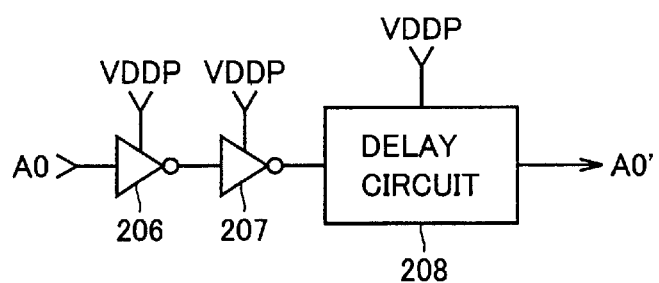

SEMICONDUCTOR DEVICE USED IN TWO SYSTEMS HAVING DIFFERENT POWER SUPPLY VOLTAGES

BACKGROUND OF THE INVENTION

1. Field of the Invention

The present invention relates to a semiconductor device, and more particularly to a semiconductor device which is used in two systems having different power supply voltages.

2. Description of the Background Art

In recent years, communication information equipment have been increasingly made small in size and mobile. LSI's mounted on the equipment are required to decrease power consumption and voltage, accordingly. This is true for a DRAM which is a kind of an LSI. To meet demand for decreasing voltage, it is necessary to satisfy requirements of a 1.8 V-system interface besides a conventional TTL-system interface.

As shown in FIG. 27, for a TTL-system interface, an external power supply voltage VDD and an output power supply voltage VDDQ are both set at 3.3 V, VIH of an input signal is set at not less than 2.0 V and VIL of the input signal is set at not more than 0.8 V. For a 1.8 V-system interface, external power supply voltage VDD is set at 2.5 V, and output power supply voltage VDDQ is set at 1.8 V, VIH of an input signal is set at not less than 1.44 V and VIL of the input signal is set at not more than 0.36 V.

In a conventional DRAM, an internal power supply voltage VDDP (2.5 V) is generated from external power supply voltage VDD (3.3 V or 2.5 V) and an initial input inverter which uses internal power supply voltage VDDP as a driving voltage determines the logical level of an input signal.

FIG. 28 is a circuit block diagram which shows the configuration of a clock buffer 200 of the conventional DRAM. In FIG. 28, clock buffer 200 includes inverters 201 and 202 and a pulse generation circuit 203 which are driven by internal power supply voltage VDDP. Inverter 201, which has a predetermined threshold voltage VTH (e.g., 1.25 V), outputs an "L" level signal if the level of a clock signal CLK is higher than that of VTH and outputs an "H" level signal if the level of clock signal CLK is lower than that of VTH. The output signal of inverter 201 is inverted by inverter 202 and the inverted signal is applied to pulse generation circuit 203. Pulse generation circuit 203 sets a signal ZCLKF at "L" level for predetermined time in response to the rising edge of the output signal of inverter 202. The DRAM operates synchronously with internal clock signal ZCLKF.

FIG. 29 is a circuit block diagram which shows the configuration of an input buffer 205 of the conventional DRAM. In FIG. 29, input buffer 205 includes inverters 206 and 207 which are driven by internal power supply voltage VDDP and a delay circuit 208. Inverter 206 outputs an "L" level signal if the level of an address signal A0 is higher than that of threshold voltage VTH and outputs an "H" level signal if the level of address signal A0 is lower than that of threshold voltage VTH. The output signal of inverter 206 is inverted by inverter 207 and the inverted signal is applied to delay circuit 208. Delay circuit 208 delays the output signal of inverter 207 by predetermined time and generates an internal address signal A0'. Internal address signal A0' is applied to the internal circuits of the DRAM.

FIG. 30 is a circuit block diagram which shows the configuration of an input protection circuit 211 of the conventional DRAM. In FIG. 30, input protection circuit 211 is provided between an external pin 210 and input buffer 205, and includes diodes 212 and 213 and a resistance element 214. Diode 212 is connected between a node N212 and an external power supply voltage VDD line and diode 213 is connected between a ground potential GND line and node N212. Node N212 is connected to external pin 210 and also connected to an input node N205 of input buffer 205 through resistance element 214.

It is assumed that the threshold voltages of diodes 212 and 213 are Vth, respectively. If the potential of node N212 is higher than VDD +Vth, diode 212 becomes conductive. If the potential of node N212 is lower than −Vth, diode 213 becomes conductive. Therefore, even if a surge voltage is applied to external pin 210, the potential of node N212 is restricted to a range between −Vth and VDD +Vth, thereby protecting the internal circuits of the DRAM from the surge voltage.

FIG. 31 is a circuit diagram which shows the configuration of an output buffer 220 of the conventional DRAM. In FIG. 31, output buffer 220 includes P-channel MOS transistors 221 and 222 and N-channel MOS transistors 223 and 224. MOS transistors 221 and 223 are connected in series between an output power supply potential VDDQ line and a ground potential GND line, and MOS transistors 222 and 224 are connected in series between an output power supply potential VDDQ line and a ground potential GND line. The gates of MOS transistors 221 and 223 receive an internal data signal RDH, respectively, the gate of P-channel MOS transistor 222 receives a signal ZOH which appears at a node between MOS transistors 221 and 222, and that of N-channel MOS transistor 224 receives an internal data signal OL. An output data signal Q is outputted from a node N222 between MOS transistors 222 and 224.

If internal data signals RDH and OL are at "L" level and "H" level, respectively, then MOS transistors 221 and 224 become conductive, MOS transistors 222 and 223 become nonconductive and external data signal Q is set at "L" level. If internal data signals RDH and OL are "H" level and "L" level, respectively, then MOS transistors 222 and 223 become conductive, MOS transistors 221 and 224 become nonconductive and external data signal Q is set at "H" level.

The conventional DRAM has, however, the following disadvantages. In clock buffer 200 shown in FIG. 28, one inverter 201 which is driven by internal power supply voltage VDDP of 2.5 V determines both the level of clock signal CLK for the TTL-system interface and that of clock signal CLK for the 1.8 V-system interface. This makes it difficult to set the sizes of transistors included in inverter 201 at optimum values, respectively, which disadvantageously lowers the certainty of the determination of the level of clock signal CLK and increases a pass current which passes through inverter 201. The pass current which passes through inverter 201 increases particularly for the 1.8 V-system interface for which the amplitude voltage of clock signal CLK is relatively smaller than power supply voltage VDDP of inverter 201. The same thing is true for input buffer 205 shown in FIG. 29.

Further, in a communication information equipment of a certain kind, power supply voltage VDD is set at 0 V in a standby state so as to decrease power consumption. In input protection circuit 211 shown in FIG. 30, if external pin 210 is applied with a "H" level voltage while power supply voltage VDD is set at 0 V, a current is carried to the power supply voltage VDD line from external pin 210 through diode 212, which adversely influences an entire system.

Moreover, in output buffer 220 shown in FIG. 31, if the current driving force of P-channel MOS transistor 222 is set to be used for the TTL-system interface (VDDQ=3.3 V), it becomes insufficient for the 1.8 V-system interface (VDDQ= 1.8 V). Conversely, if the current driving force of P-channel MOS transistor 222 is set to be used for the 1.8 V-system interface, it becomes excessive for the TTL-system interface.

SUMMARY OF THE INVENTION

It is, therefore, an object of the present invention to provide a semiconductor device which can be used in two systems having different power supply voltages.

A semiconductor device according to the present invention has a first mode in which the semiconductor device is driven by a first power supply voltage and receives a first signal having an amplitude voltage lower than the first power supply voltage, and a second mode in which the semiconductor device is driven by a second power supply voltage lower than the first power supply voltage and receives a second signal having a second amplitude voltage lower than the second power supply voltage. The semiconductor device includes: a first logic circuit activated in the first mode to be driven by a first internal power supply voltage equal in level to the second power supply voltage, detecting whether the first signal is higher in level than a first threshold voltage, and outputting a signal of level according to a detection result; a second logic circuit activated in the second mode to be driven by a second internal power supply voltage lower than the first internal power supply voltage, detecting whether the second signal is higher in level than a second threshold voltage, and outputting a signal of level according to a detection result; and an internal circuit performing a predetermined operation in response to output signals of the first and second logic circuits. Accordingly, the first logic circuit which determines the level of the input signal in the first mode and the second logic circuit which determines the level of the input signal in the second mode are separately provided. It is, therefore, possible to easily set sizes of transistors at optimum values, respectively, in each of the first and second logic circuits. Thus, it is possible to accurately determine the level of the input signal and to suppress pass currents, which pass through the first and second logic circuits, to be low.

Further, another semiconductor device according to the present invention has a first mode in which the semiconductor device receives a first output power supply voltage, and a second mode in which the semiconductor device receives a second output power supply voltage lower than the first output power supply voltage. This semiconductor device includes: an internal circuit performing a predetermined operation; and an output circuit driven by the first and second output power supply voltages, and outputting a signal generated in the internal circuit to an outside of the semiconductor device. The output circuit includes: a first P-type transistor having a first electrode receiving the first and second output power supply voltages, and a second electrode connected to an output node; a voltage supply circuit outputting a ground voltage in the first mode, and outputting a predetermined negative voltage in the second mode; and a switching element having one electrode connected to a gate electrode of the first P-type transistor and the other electrode receiving an output voltage of the voltage supply circuit, and become conductive or nonconductive according to the signal generated in the internal circuit. Accordingly, by applying the ground voltage to the gate electrode of the first P-type transistor in the first mode and applying the negative voltage to the gate electrode of the first P-type transistor in the second mode, it is possible to set the current driving force of the first P-type transistor at an optimum value in each of the first and second modes.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 27 is a table for comparing a TTL-system interface with a 1.8 V-system interface;

FIG. 28 is a circuit block diagram showing a configuration of a clock buffer of a conventional DRAM;

FIG. 29 is a circuit block diagram showing a configuration of an input buffer of the conventional DRAM;

DESCRIPTION OF THE PREFERRED EMBODIMENTS

First Embodiment

Figure 1:
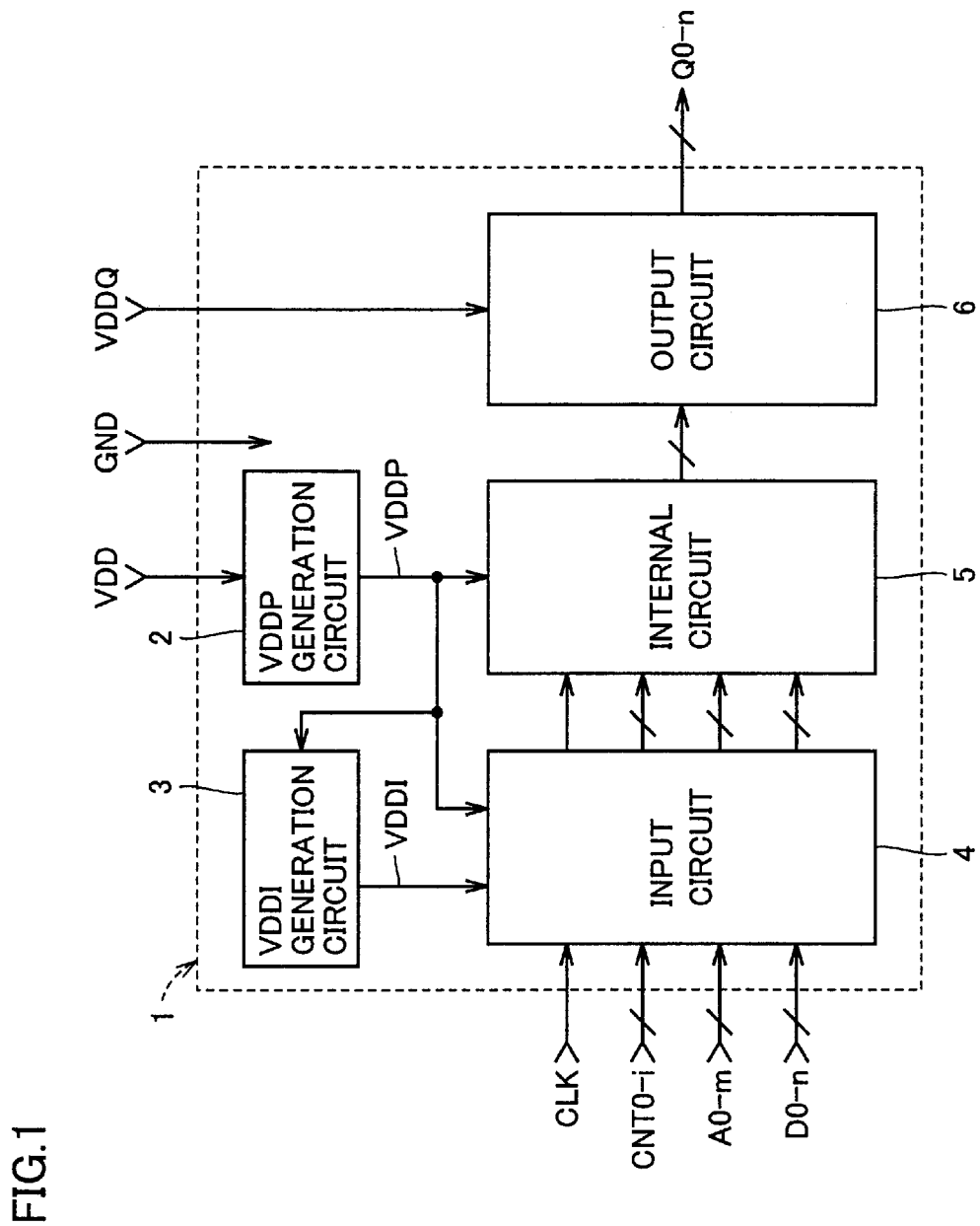
FIG. 1 is a block diagram showing an entire configuration of a DRAM according to a first embodiment of the present invention.

FIG. 1 is a block diagram showing an overall configuration of a DRAM 1 according to a first embodiment of the present invention. In FIG. 1, DRAM 1 includes a VDDP generation circuit 2, a VDDI generation circuit 3, an input circuit 4, an internal circuit 5 and an output circuit 6, and is driven by power supply potential VDD (3.3 V or 2.5 V) applied from the outside of DRAM 1, output power supply potential VDDQ (3.3 V or 1.8 V) and ground potential GND (0 V). If DRAM 1 is used by a memory system which employs a TTL-system interface, power supply voltage VDD and output power supply voltage VDDQ are both set at 3.3 V. If DRAM 1 is used by a memory system which employs a 1.8 V-system interface, power supply voltage VDD and output power supply voltage VDDQ are set at 2.5 V and 1.8 V, respectively (see FIG. 27).

VDDP generation circuit 2 drops external power supply potential VDD (3.3 V), generates internal power supply voltage VDDP (2.5 V) and applies generated internal power supply voltage VDDP to input circuit 4 and internal circuit 5. VDDI generation circuit 3 drops internal power supply potential VDDP (2.5 V), generates internal power supply voltage VDDI (1.8 V) and applies generated internal power supply voltage VDDI to input circuit 4. Input circuit 4 is driven by internal power supply potentials VDDP and VDDI and transmits clock signal CLK, control signals CNT0 to CNTi (where i is an integer not smaller than 0), address signals A0 to Am (where m is an integer not smaller than 0) and data signals D0 to Dn (where n is an integer not smaller than 0), to internal circuit 5. If DRAM 1 is used by the memory system which employs the TTL-system interface, VIH of each signal is set at not less than 2.0 V and VIL thereof is set at not more than 0.8 V. If DRAM 1 is used by the memory system which employs 1.8 V-system interface, VIH of each signal is set at not less than 1.44 V and VIL thereof is set at not more than 0.36 V (see FIG. 27).

Internal circuit 5 is driven by internal power supply voltage VDDP and operates synchronously with clock signal CLK. Internal circuit 5 includes a plurality of memory cells which are arranged in a plurality of rows and columns. Each memory cell stores one data signal. A plurality of memory cells are grouped by (n+1) cells, respectively, in advance. Each memory cell group is allocated an inherent address signal in advance.

Internal circuit 5 is controlled by control signals CNT0 to CNTi, writes data signals D0 to Dn to the (n+1) memory cells which belong to the memory cell group corresponding to address signals A0 to Am during a write operation, respectively, and reads data signals Q0 to Qn from the (n+1) memory cells which belong to the memory cell group corresponding to address signals A0 to Am and applies the data signals Q0 to Qn to output circuit 6, respectively during a read operation. Output circuit 6 is driven by output power supply voltage VDDQ and outputs read data signal Q0 to Qn from internal circuit 5 to the outside of DRAM 1.

Figure 2:
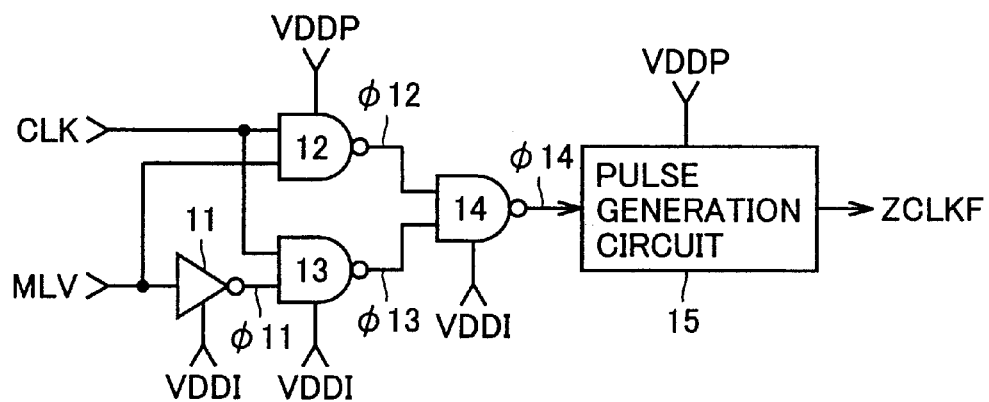
FIG. 2 is a circuit block diagram showing a configuration of a clock buffer included in an input circuit shown in FIG. 1.

A clock buffer 10 which is a feature of the present invention will now be described. FIG. 2 is a circuit block diagram which shows a configuration of clock buffer 10 included in input circuit 4 shown in FIG. 1. In FIG. 2, clock buffer 10 includes an inverter 11, NAND gates 12 to 14 and a pulse generation circuit 15. NAND gate 12 is driven by internal power supply voltage VDDP, receives clock signal CLK and a control signal MLV, and outputs a signal φ12.

Figure 13:
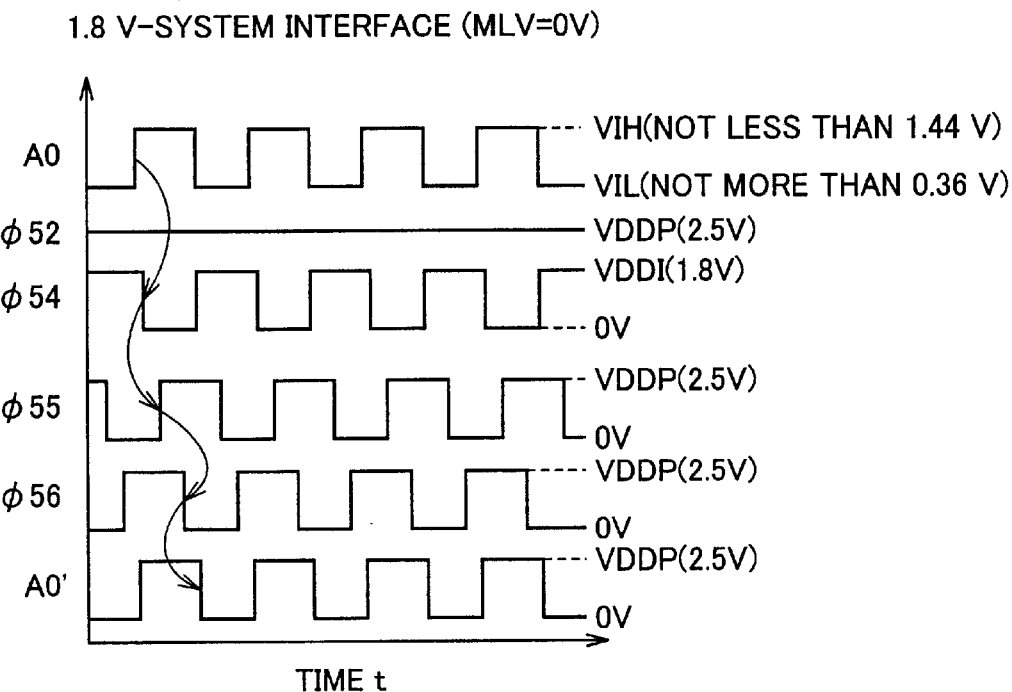
FIG. 13 is a time chart showing an operation of the input buffer shown in FIG. 10.

As shown in FIG. 13, NAND gate 12 includes P-channel MOS transistors 21 and 22 and N-channel MOS transistors 23 and 24. P-channel MOS transistors 21 and 22 are connected in parallel between an internal power supply potential VDDP line and an output node N21 and the gates thereof receive signals CLK and MLV, respectively. N-channel MOS transistors 23 and 24 are connected in series between output node N21 and a ground potential GND line and the gates thereof receive signals CLK and MLV, respectively.

If DRAM 1 is used by a memory system which employs the 1.8 V-system interface, signal MLV is set at "L" level (0 V). If DRAM 1 is used by a memory system which employs the TTL-system interface, signal MLV is set at "H" level (VDDP=2.5 V). Signal MLV may be generated by internal circuit 5 in accordance with control signal CNT0 to CNTi, may be generated by detecting output power supply voltage VDDQ or may be directly inputted from the outside of DRAM 1.

If signal MLV is at "L" level, then P-channel MOS transistor 22 becomes conductive, N-channel MOS transistor 24 becomes nonconductive and the level of output signal φ12 fixed to "H" level (VDDP=2.5 V). If signal MLV is at "H" level, then P-channel MOS transistor 22 becomes nonconductive, N-channel MOS transistor 24 becomes conductive and NAND gate 12 operates as an inverter for clock signal CLK. Therefore, output signal φ12 of NAND gate 12 becomes a clock signal equal in phase to the inverted signal of clock signal CLK at an amplitude voltage of VDDP. If signal MLV is at "H" level, then power supply voltage VDDP of NAND gate 12 is 2.5 V, "H" level of clock signal CLK is set at not less than 2.0 V and "L" level thereof is set at not more than 0.8 V. As a result, a pass current which passes through NAND gate 12 is suppressed to be low. The sizes of MOS transistors 21 to 24 are set at optimum values, respectively, so that the level of clock signal CLK can be accurately determined and the pass current becomes low if signal MLV is at "H" level. The threshold voltage of NAND gate 12 for clock signal CLK is set at, for example, 1.25 V.

Figure 4:
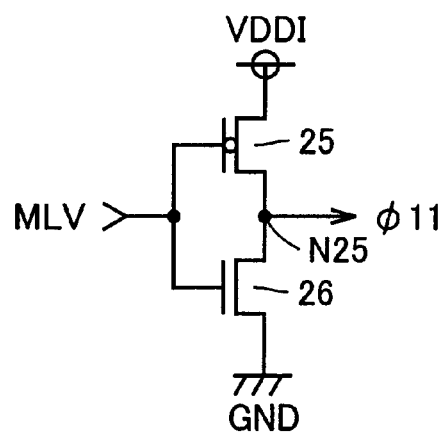
FIG. 4 is a circuit diagram showing a configuration of an inverter 11 shown in FIG. 2.

Inverter 11 is driven by internal power supply voltage VDDI and generates an inverted signal φ11 of signal MLV. As shown in FIG. 4, inverter 11 includes a P-channel MOS transistor 25 and an N-channel MOS transistor 26. P-channel MOS transistor 25 is connected between an internal power supply potential VDDI line and an output node N25 and the gate thereof receives signal MLV. N-channel MOS transistor 26 is connected between output node N25 and a ground potential GND line and the gate thereof receives signal MLV. If signal MLV is at "L" level, then P-channel MOS transistor 25 becomes conductive, N-channel MOS transistor 25 becomes nonconductive and the level of signal φ11 is set at "H" level (VDDI=1.8 V). If signal MLV is at "H" level, then P-channel MOS transistor 25 becomes nonconductive, N-channel MOS transistor 26 becomes conductive and the level of signal φ11 is set at "L" level (GND=0 V). Since amplitude voltage VDDP of signal MLV is higher than power supply voltage VDDI of inverter 11, the pass current which passes through inverter 11 is suppressed to be low.

Figure 3:
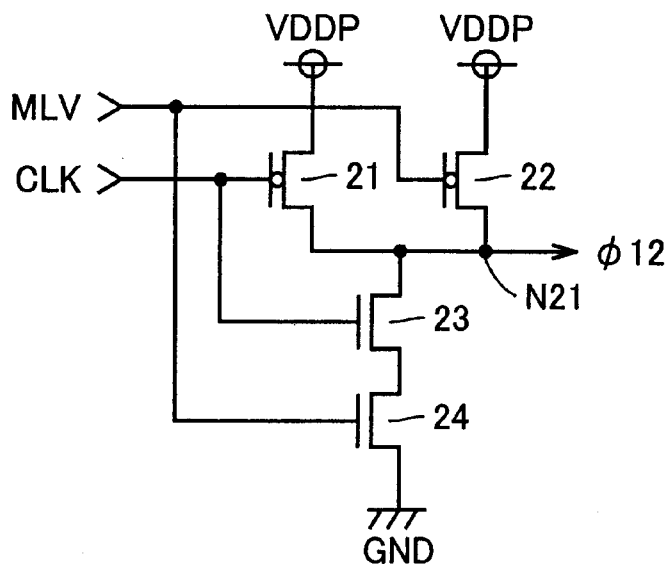
FIG. 3 is a circuit diagram showing a configuration of a NAND gate 12 shown in FIG. 2.

NAND gate 13 is driven by internal power supply voltage VDDI, receives clock signal CLK and output signal φ11 of inverter 11, and outputs a signal φ13. NAND gate 13 includes P MOS transistors 21 and 22 and N-channel MOS transistors 23 and 24 as in the case of NAND gate 12 shown in FIG. 3, receives internal power supply potential VDDI instead of internal power supply potential VDDP, and receives signal φ11 instead of signal MLV.

If signal φ11 is at "H" level (i.e., signal MLV is at "L" level), NAND gate 13 operates as an inverter for clock signal CLK and signal φ13 becomes a clock signal equal in phase to the inverted signal of clock signal CLK at an amplitude voltage of VDDI. If signal φ11 is at "L" level (i.e., if signal MLV is at "H" level), the level of signal φ13 is fixed to "H" level (VDDI=1.8 V).

If signal MLV is at "L" level, the power supply voltage of NAND gate 13 is VDDI=1.8 V and "H" level of clock signal CLK is set at not less than 1.44 V and "L" level thereof is set at not more than 0.36 V. Therefore, a pass current which passes through NAND gate 13 is suppressed to be low. If signal MLV is at "H" level, no pass current flows in NAND gate 13. The sizes of MOS transistors 21 to 24 of NAND gate 13 are set at optimum values, respectively so that the level of clock signal CLK can be accurately determined and the pass current of NAND gate 13 becomes low if signal MLV is at "L" level. The threshold voltage of NAND gate 13 for clock signal CLK is set at, for example, 0.9 V.

NAND gate 14 is driven by internal power supply voltage VDDI, receives output signals φ12 and φ13 of NAND gates 12 and 13, respectively, and outputs a signal φ14. NAND gate 14 includes P-channel MOS transistors 21 and 22 and N-channel MOS transistors 23 and 24 same as in the case of NAND gate 12 shown in FIG. 3, receives internal power supply potential VDDI instead of internal power supply potential VDDP, and receives signals φ12 and φ13 instead of signals MLV and CLK.

Figure 5:
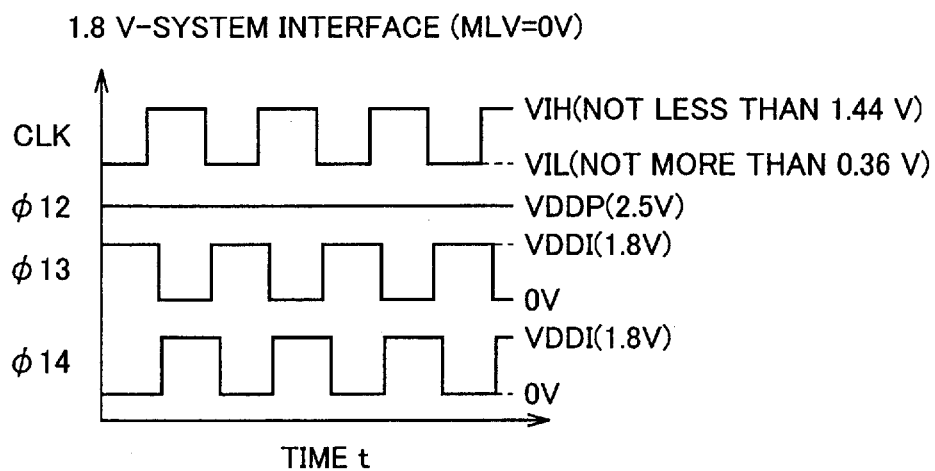
FIG. 5 is a time chart showing operations of NAND gates 12 to 14 shown in FIG. 2.

If signal MLV is at "L" level (0 V), the level of output signal φ12 of NAND gate 12 is fixed to "H" level (VDDP =2.5 V) as shown in FIG. 5 and output signal φ13 of NAND gate 13 becomes a clock signal substantially equal in phase to the inverted signal of clock signal CLK at an amplitude voltage of VDDI=1.8 V. Therefore, NAND gate 14 operates as an inverter for clock signal φ13, and output signal φ14 of NAND gate 14 becomes a clock signal substantially equal in phase to clock signal CLK at an amplitude voltage of VDDI=1.8 V.

Figure 6:
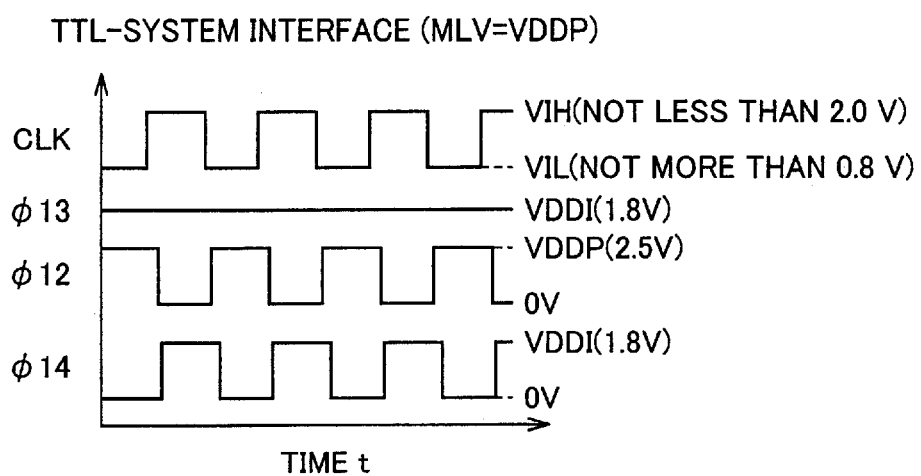
FIG. 6 is another time chart showing operations of NAND gates 12 to 14 shown in FIG. 2.

If signal MLV is at "H" level (VDDP=2.5 V), the level of output signal φ13 of NAND gate 13 is fixed to "H" level (VDDI=1.8 V) as shown in FIG. 6 and output signal φ12 of NAND gate 12 becomes a clock signal substantially equal in phase to the inverted signal of clock signal CLK at an amplitude voltage of VDDP=2.5 V. Therefore, NAND gate 18 operates as an inverter for clock signal φ12, and output signal 14 of NAND gate 14 becomes a clock signal substantially equal in phase to clock signal CLK at an amplitude voltage of VDDI=1.8 V. Whichever level signal MLV is, "L" level or "H" level, amplitude voltages VDDP and VDDI of input signals φ12 and φ13 of NAND gate 14 are not less than driving voltage VDDI of NAND gate 14. Therefore, a pass current which passes through NAND gate 14 is suppressed to be low.

Figure 7:
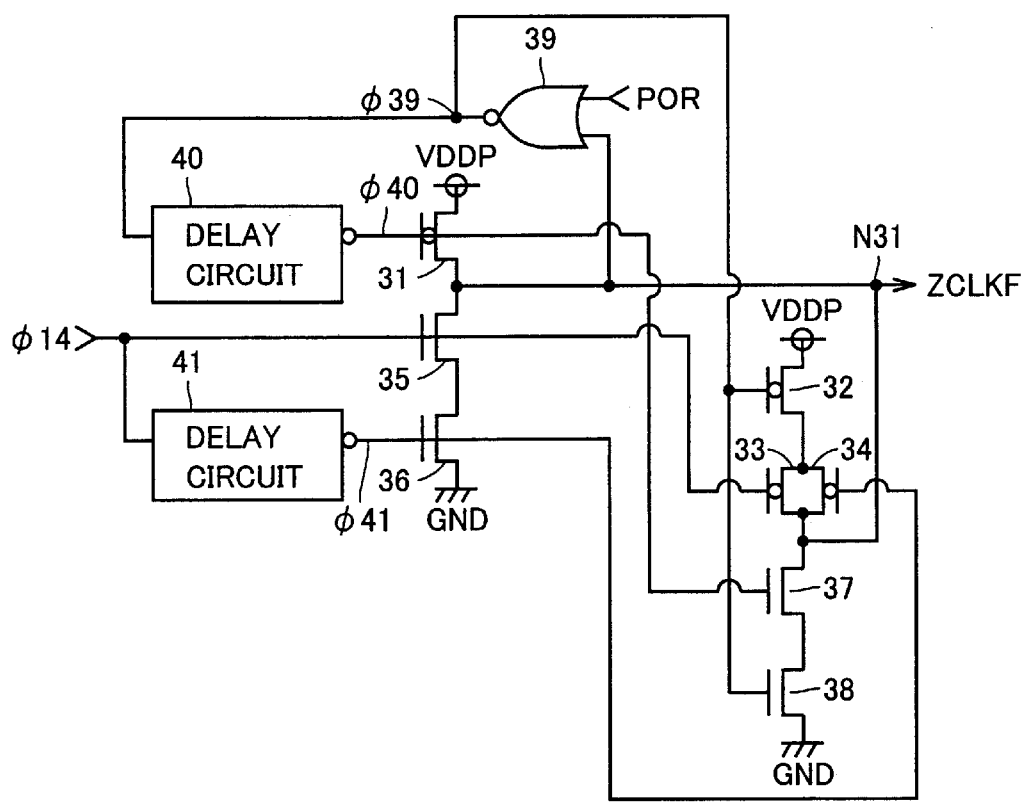
FIG. 7 is a circuit block diagram showing a configuration of a pulse generation circuit shown in FIG. 2.

Pulse generation circuit 15 sets internal clock signal ZCLKF at "L" level for predetermined time in response to the rising edge of output clock signal φ14 of NAND gate 14. Namely, as shown in FIG. 7, pulse generation circuit 15 includes P-channel MOS transistors 31 to 34, N-channel MOS transistors 35 to 38, and an NOR gate 39 and delay circuits 40 and 41. P-channel MOS transistor 31 is connected between an internal power supply potential VDDP line and an output node N31, and N-channel MOS transistors 35 and 36 are connected in series between output node N31 and a ground potential GND line. P-channel MOS transistors 32 and 33 are connected in series between an internal power supply potential VDDP line and output node N31, P-channel MOS transistor 34 is connected in parallel to P-channel MOS transistor 33, and N-channel MOS transistors 37 and 38 are connected in series between output node N31 and a ground potential GND line.

Output signal φ14 of NAND gate 14 in front of pulse generation circuit 15 is inputted into the gates of N-channel MOS transistor 35 and P-channel MOS transistor 33, and also inputted into delay circuit 41. Delay circuit 41 delays signal φ14 by predetermined time T41, inverts signal φ14 and outputs a signal φ41. Signal φ41 is inputted into the gates of N-channel MOS transistor 36 and P-channel MOS transistor 34.

NOR gate 39 receives a power-on reset signal POR the level of which is raised to "H" level for predetermined time after external power supply voltage VDD is applied, receives internal clock signal ZCLKF which is the output signal of pulse generation circuit 15, and outputs a signal φ39. Output signal φ39 of NOR gate 39 is inputted into the gates of P-channel MOS transistor 32 and N-channel MOS transistor 38 and also inputted into delay circuit 40. Delay circuit 40 delays signal φ39 for predetermined time T40, inverts signal φ39, and generates a signal φ40. Signal φ40 is inputted into the gates of P-channel MOS transistor 31 and N-channel MOS transistor 37.

Figure 8:
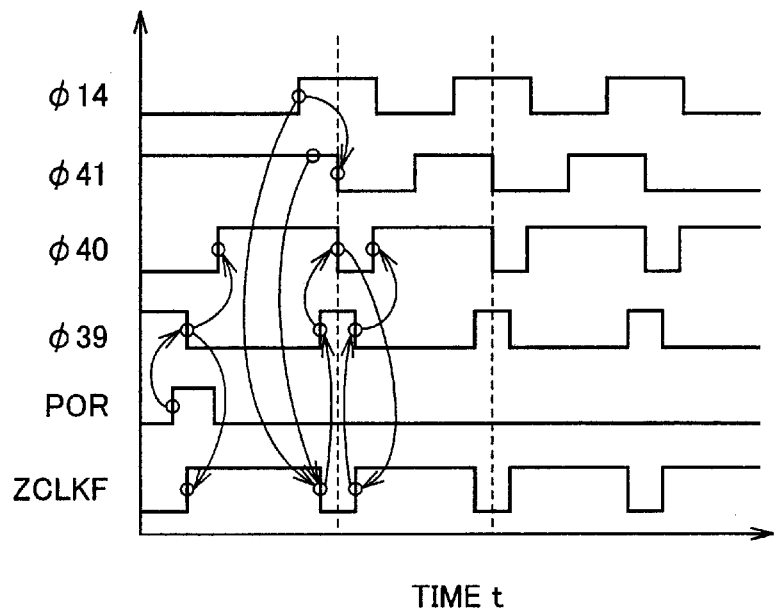
FIG. 8 is a time chart showing an operation of the pulse generation circuit shown in FIG. 7.

FIG. 8 is a time chart showing an operation of pulse generation circuit 15 shown in FIG. 7. In an initial state, signal φ14 is set at "L" level, MOS transistors 33 and 36 become conductive, and MOS transistors 34 and 35 become nonconductive. If the level of power-on reset signal POR is raised to "H" level at prescribed time for predetermined time, then the level of output signal φ39 of NOR gate 39 is fallen to "L" level, P-channel MOS transistor 32 becomes conductive, N-channel MOS transistor 38 becomes nonconductive and the level of internal clock signal ZCLKF is raised to "H" level. Further, the level of output signal φ40 of delay circuit 40 is raised to "H" level, P-channel MOS transistor 31 becomes nonconductive and N-channel MOS transistor 37 becomes conductive.

If the level of signal φ14 is raised to "H" level, then N-channel MOS transistor 35 becomes conductive, P-channel MOS transistor 33 becomes nonconductive and the level of internal clock signal ZCLKF is fallen to "L" level. After the elapse of predetermined time T41 after the level of signal φ14 is raised to "H" level, the level of output signal φ41 of delay circuit 41 is fallen to "L" level, N-channel MOS transistor 36 becomes nonconductive and P-channel MOS transistor 34 becomes conductive.

If the level of internal clock signal ZCLKF is fallen to "L" level, then the level of output signal φ39 of NOR gate 39 is raised to "H" level, P-channel MOS transistor 32 becomes nonconductive and N-channel MOS transistor 38 becomes conductive. After the elapse of predetermined time T40 after the level of signal φ39 is raised to "H" level, the level of output signal φ40 of delay circuit 40 is fallen to "L" level, P-channel MOS transistor 31 becomes conductive and N-channel MOS transistor 37 becomes nonconductive and the level of internal clock signal ZCLKF is raised to "H" level.

If the level of internal clock signal ZCLKF is raised to "H" level, then the level of output signal φ39 of NOR gate 39 is fallen to "L" level and the level of output signal φ40 of delay circuit 40 is raised to "H" level after the elapse of predetermined time T40. Thereafter, the level of internal clock signal ZCLKF is fallen to "L" level for the predetermined time whenever the level of clock signal CLK is raise to "H" level. DRAM 1 operates synchronously with internal clock signal ZCLKF.

In this first embodiment, NAND gate 12 which determines the level of clock signal CLK if DRAM 1 is used for the TTL-system interface and NAND gate 13 which determines the level of clock signal CLK if DRAM 1 is used for the 1.8 V-system interface, are separately provided. Therefore, it is possible to easily set the sizes of MOS transistors 21 to 24 in NAND gates 12 and 13, separately from each other. It is, therefore, possible to accurately determine the level of internal clock signal CLK and to suppress pass currents which pass through NAND gates 12 and 13 to be low.

Further, one of output signals φ12 and φ13 of NAND gates 12 and 13 is selected by NAND gate 14 which is driven by internal power supply voltage VDDI. As a result, amplitude voltages VDDP and VDDI of input signals φ12 and φ13 become not less than power supply voltage VDDI of NAND gate 14. Therefore, it is also possible to suppress a pass current which passes through NAND gate 14 to be low.

While VDDI generation circuit 3 is provided in the first embodiment, it is also possible to eliminate VDDI generation circuit 3 and use VDDQ instead of VDDI. In this case, it is possible to simplify the configuration of DRAM 1 and to reduce the layout area thereof.

Figure 9:
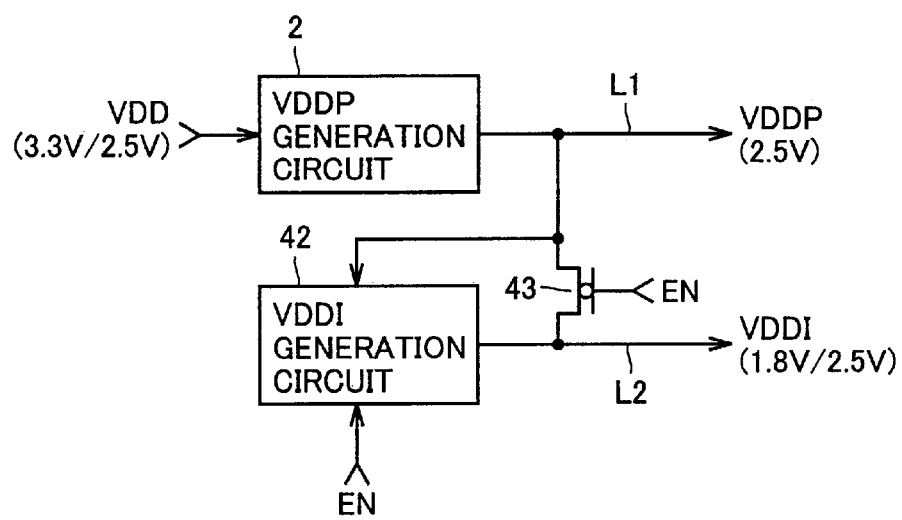
FIG. 9 is a circuit block diagram showing a modification of the first embodiment.

FIG. 9 is a circuit block diagram showing a modification of the first embodiment. A DRAM shown in FIG. 9 differs from DRAM 1 shown in FIG. 1 in that VDDI generation circuit 3 is replaced by a VDDI generation circuit 42 and a P-channel MOS transistor 43 is added. VDDI generation circuit 42 is activated if a signal EN is set at active level of "H" level, drops internal power supply voltage VDDP, and generates internal power supply potential VDDI. P-channel MOS transistor 43 is connected between an internal power supply potential VDDP line L1 and an internal power supply potential VDDI line L2, and the gate thereof receives signal EN. The level of signal EN is set at "L" level if the DRAM is used for the TTL-system interface and set at "H" level if the DRAM is used for the 1.8 V-system interface.

If signal EN is at active level of "H" level, then VDDI generation circuit 42 is activated, P-channel MOS transistor 43 becomes nonconductive and VDDP generation circuit 2 and VDDI generation circuit 42 output internal power supply potentials VDDP and VDDI, respectively. If signal EN is at inactive level of "L" level, then VDDI generation circuit 42 is deactivated, P-channel MOS transistor 43 becomes conductive, internal power supply potential VDDP is applied to line L1 and also applied to line L2 through P-channel MOS transistor 43. In this case, VDDP and VDDI are 2.5 V. The response rates of inverter 11 and NAND gates 13 and 14 become slow, the delay time of internal clock signal ZCLK from external CLK becomes short and DRAM access rate is accelerated.

Second Embodiment

Figure 10:
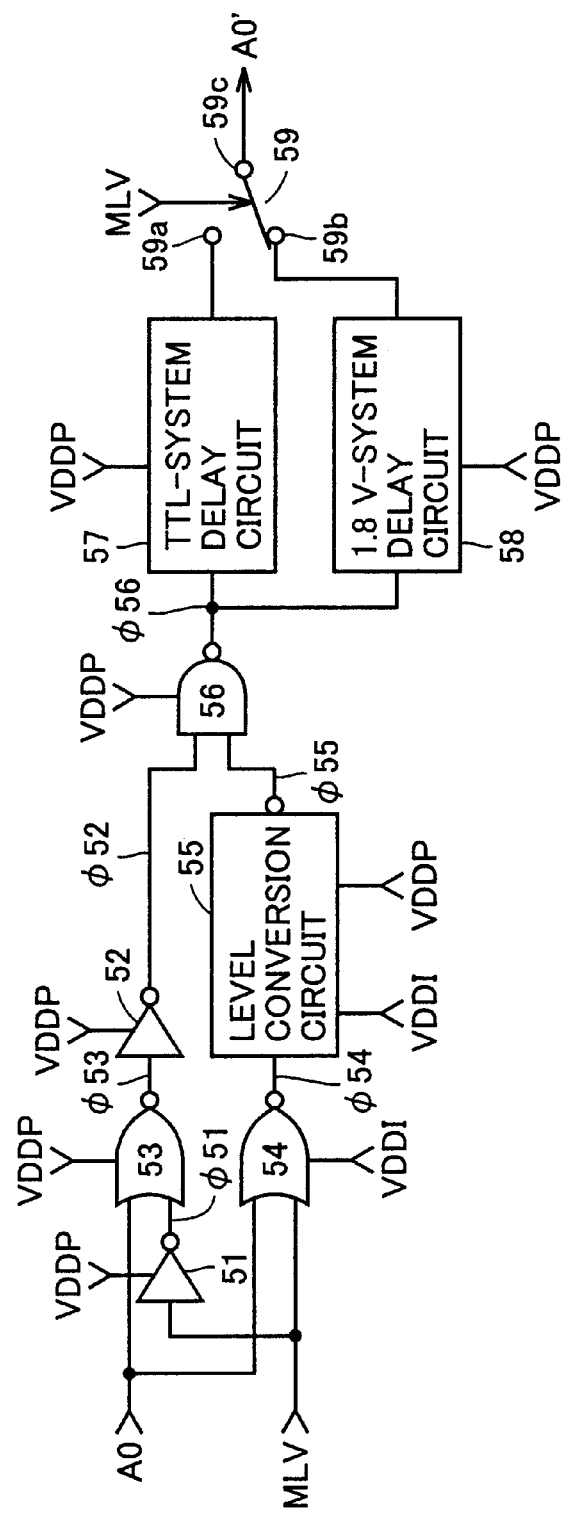
FIG. 10 is a circuit block diagram showing an input buffer of a DRAM according to a second embodiment of the present invention.

FIG. 10 is a circuit block diagram which shows a configuration of an input buffer 50 of a DRAM according to a second embodiment of the present invention. Input buffer 50 is included in input circuit 4 shown in FIG. 1 and provided to correspond to each of control signals CNT0 to CNTi, address signals A0 to Am and data signals D0 to Dn. In FIG. 10, input buffer 50 which corresponds to address signal A0 is shown. In FIG. 10, input buffer 50 includes inverters 51 and 52, NOR gates 53 and 54, a level conversion circuit 55, a NAND gate 56, a TTL-system delay circuit 57, a 1.8 V-system interface delay circuit 58 and a switch 59. NOR gate 54 is driven by internal power supply voltage VDDI, level conversion circuit 55 is driven by internal power supply voltages VDDI and VDDP, remaining circuits 51 to 53 and 56 to 59 are driven by internal power supply voltage VDDP.

Address signal A0 is inputted into the input node of one of each of NOR gates 53 and 54. Signal MLV is inputted into the other node of NOR gate 53 through an inverter 51 and also inputted into the other node of NOR gate 54.

Figure 11:
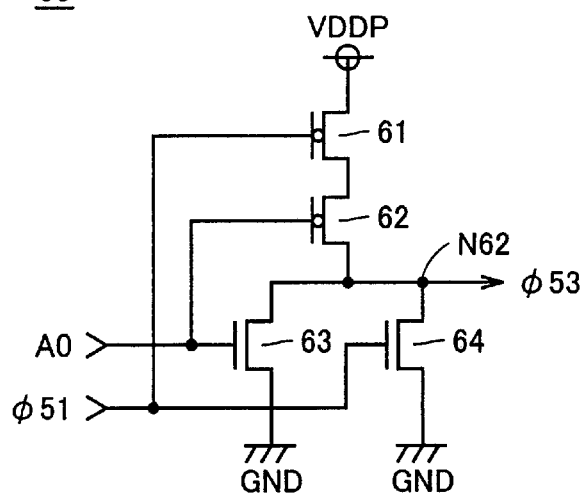
FIG. 11 is a circuit diagram showing a configuration of a NOR gate 53 shown in FIG. 10.

As shown in FIG. 11, NOR gate 53 includes P-channel MOS transistors 61 and 62 and N-channel MOS transistors 63 and 64. P-channel MOS transistors 61 and 62 are connected between an internal power sully VDDP line and an output node N62 and the gates thereof receive signals φ51 and A0, respectively. N-channel MOS transistors 63 and 64 are connected in parallel between output node N62 and a ground potential GND line and the gates thereof receive signals A0 and φ51, respectively.

If signal φ51 is at "H" level (i.e., if signal MLV is at "L level"), then P-channel MOS transistors 61 becomes nonconductive, N-channel MOS transistor 64 becomes conductive and the level of output signal φ53 of NOR gate 53 is fixed to "L" level (0 V). If signal φ51 is at "L" level (i.e., if signal MLV is at "H level"), then P-channel MOS transistors 61 becomes conductive, N-channel MOS transistor 64 becomes nonconductive and NOR gate 53 operates as an inverter for address signal A0. Therefore, output signal φ53 of NOR gate 53 becomes a signal equal in phase to the inverted signal of address signal A0 at an amplitude voltage of VDDP.

If signal MLV is at "H" level, power supply voltage VDDP of NOR gate 53 is 2.5 V. If so, the "H" level of address signal A0 is set at not less than 2.0 V and "L" level thereof is set at not more than 0.8 V. Therefore, a pass current which passes through NOR gate 53 is suppressed to be low. If signal MLV is at "L" level, no pass current flows in NOR gate 53. The sizes of MOS transistors 61 to 64 of NOR gate 53 are set at optimum values, respectively, so that the level of address signal A0 can be accurately determined and the pass current which passes through NOR gate 53 can be suppressed to be low if signal MLV is at "H" level. The threshold voltage of NOR gate 53 for address signal A0 is set at, for example, 1.25 V. Signal φ53 is inputted into one input node of NAND gate 56.

NOR gate 54 includes P-channel MOS transistors 61 and 62 and N-channel MOS transistors 63 and 64 same as in the case of NOR gate 53 shown in FIG. 11, receives signal MLV instead of signal φ51, and receives internal power supply potential VDDI instead of internal power supply potential VDDP. If signal MLV is at "L" level, NOR gate 54 operates as an inverter for address signal A0. Therefore, output signal φ54 of NOR gate 54 becomes a signal equal in phase to the inverted signal of address signal A0 at an amplitude of VDDI. If signal MLV is at "H" level, the level of output signal φ54 of NOR gate 54 is fixed to "L" level.

If signal MLV is at "L" level, power supply voltage VDDI of NOR gate 54 is 1.8 V. If so, "H" level of address signal A0 is set at not less than 1.44 V and the "L" level thereof is set at not more than 0.36 V. Therefore, a pass current which passes through NOR gate 54 can be suppressed to be low. If signal MLV is at "H" level, no pass current passes through NOR gate 54. The sizes of MOS transistors 61 to 64 of NOR gate 54 are set at optimum values, respectively so that the level of address signal AO can be accurately determined and the pass current which passes through NOR gate 54 can be suppressed to be low if signal MLV is at "L" level. The threshold voltage of NOR gate 54 for address signal A0 is set at, for example, 0.9 V. Signal φ54 is applied to level conversion circuit 55.

Figure 12:
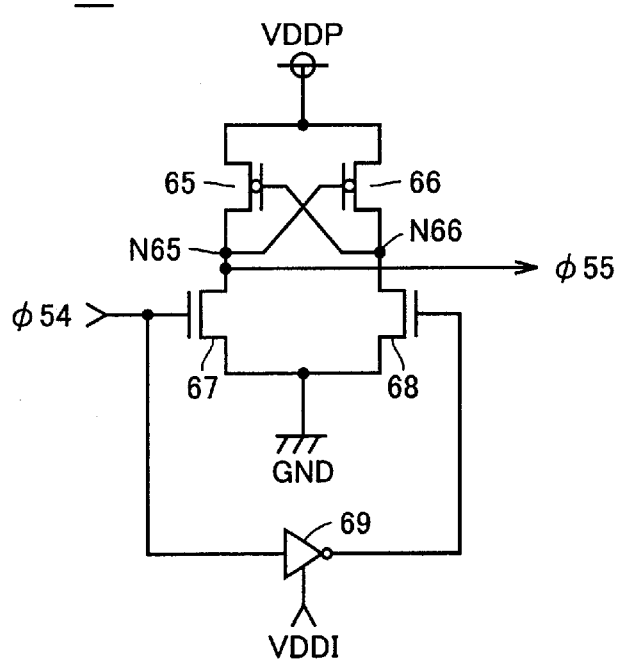
FIG. 12 is a circuit diagram showing a configuration of a level conversion circuit shown in FIG. 10.

Level conversion circuit 55 converts the amplitude voltage of signal φ54 from VDDI to VDDP and inverts signal φ54. Namely, as shown in FIG. 12, level conversion circuit 55 includes P-channel MOS transistors 65 and 66, N-channel MOS transistors 67 and 68 and an inverter 69. P-channel MOS transistors 65 and 66 are connected between an internal power supply potential VDDP line and nodes N65 and N66, respectively, and the gates thereof are connected to nodes N65 and N66, respectively. N cannel MOS transistors 67 and 68 are connected between nodes N65 and N66 and a ground potential GND line, respectively. Output signal φ54 of NOR gate 54 in front of level conversion circuit 55 is directly inputted into the gate of N-channel MOS transistor 67 and also inputted into the gate of N-channel MOS transistor 68 through inverter 69. Inverter 69 is driven by internal power supply voltage VDDI. A signal which appears at node N65 becomes a signal φ55 of level conversion circuit 55.

If signal φ54 is at "H" level (VDDI =1.8 V), then N-channel MOS transistor 67 and P-channel MOS transistor 66 become conductive, N-channel MOS transistor 68 and P-channel MOS transistor 65 become nonconductive, and the level of signal φ55 becomes "L" level (GND=0 V). If signal φ54 is at "L" level (GND=0 V), then N-channel MOS transistor 67 and P-channel MOS transistor 66 become nonconductive, N-channel MOS transistor 68 and P-channel MOS transistor 65 become conductive and the level of signal φ55 becomes "H" level (VDDP=2.5 V). Signal φ55 is inputted into the other input node of NAND gate 56.

Since the amplitude voltage of output signal φ52 of inverter 52 and that of output signal φ55 of level conversion circuit 55 are both equal to power supply voltage VDDP of NAND gate 56, the pass current which passes through NAND gate 56 can be suppressed to be low. Output signal φ56 of NAND gate 56 is applied to TTL-system delay circuit 57 and 1.8 V-system delay circuit 58.

TTL-system delay circuit 57 delays signal φ56 for predetermined time T57 and applies the delayed signal to one switching terminal 59a of switch 59. 1.8 V-System delay circuit 58 delays signal φ56 for predetermined time T58 (T58 <T57) and applies the delayed signal to the other switching terminal 59b of switch 59. The reason for setting delay time T57 of TTL-system delay circuit 57 longer than delay time T58 of 1.8 V-system delay circuit 58 is to compensate for the difference T55–T52 between delay time T55 of level conversion circuit 55 and delay time T52 of inverter 52. Accordingly, delay time T57 and T58 of delay circuits 57 and 58 is set to satisfy an expression T55+T58= T52+T57.

Switch 59 is controlled by signal MLV. If signal MLV is at "L" level, terminals 59b and 59c of switch 59 becomes conductive to each other and the output signal of 1.8 V-system delay circuit 58 becomes internal address signal A0'. If signal MLV is at "H" level, terminals 59a and 59c of switch 59 becomes conductive to each other and the output signal of TTL-system delay circuit 57 becomes internal address signal A0'.

The operation of input buffer 50 will next be described. If the DRAM is used by a memory system which employs the 1.8 V-system interface, signal MLV is set at "L" level (0 V). In this case, as shown in FIG. 13, the level of output signal φ52 of inverter 52 is fixed to "H" level (VDDP=2.5 V) and NAND gate 56 operates as an inverter for output signal φ55 of level conversion circuit 55. In addition, NOR gate 54 operates as an inverter for signal AO and terminals 59b and 59c of switch 59 become conductive to each other. Therefore, address signal AO is delayed and inverted by NOR gate 54, level conversion circuit 55, NAND gate 56, 1.8 V-system delay circuit 58 and switch 59, and turns into internal address signal A0'.

Figure 14:
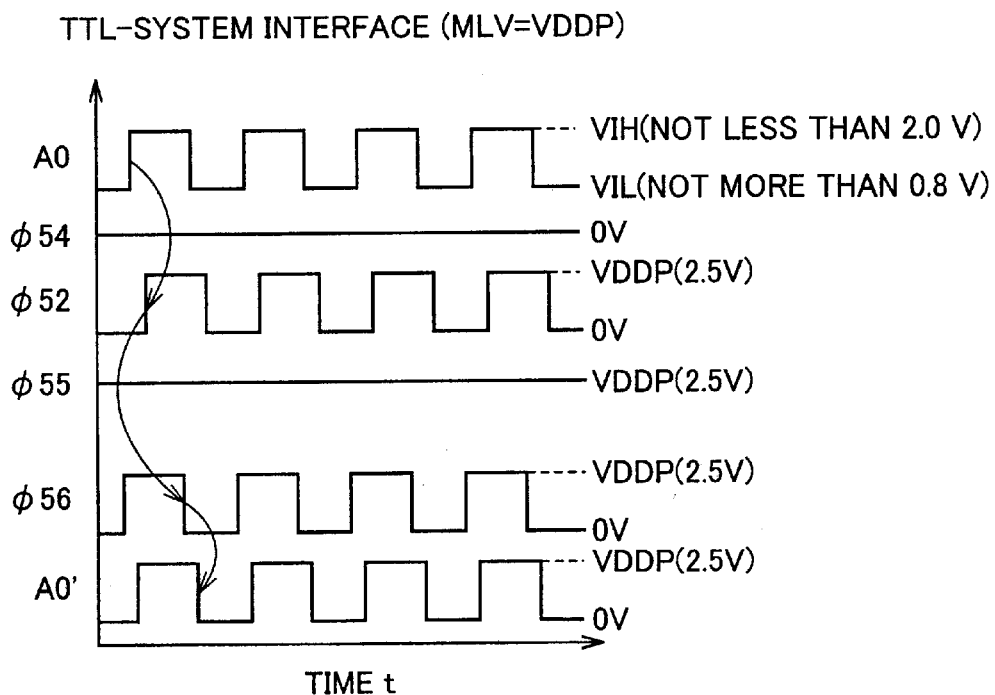
FIG. 14 is another time chart showing an operation of the input buffer shown in FIG. 10.

If the DRAM is used by a memory system which employs the TTL-system interface, signal MLV is set at "H" level (VDDP=2.5 V). In this case, as shown in FIG. 14, the level of output signal φ54 of NOR gate 54 is fixed to "L" level (0 V) and the level of output signal φ55 of level conversion circuit 55 is fixed to "H" level (VDDP=2.5 V). NOR gate 53 operates as an inverter for address signal A0, NAND gate 56 operates as an inverter for output signal φ52 of inverter 52, and terminals 59a and 59c of switch 59 become conductive to each other. Therefore, address signal AO is delayed and inverted by NOR gate 53, inverter 52, NAND gate 56, TTL-system delay circuit 57 and switch 59, and turns into internal address signal A0'.

In this second embodiment, NOR gate 53 which determines the level of the input signal (e.g. A0) if the DRAM is used for the TTL-system interface and NOR gate 54 which determines the level of input signal A0 if the DRAM is used for the 1.8 V-system interface, are separately provided. Therefore, it is possible to easily set the sizes of MOS transistors 61 to 64 in NOR gates 53 and 54, separately from each other. It is, therefore, possible to accurately determine the level of input signal A0 and to suppress pass currents which pass through NOR gates 53 and 54 to be low.

Further, the amplitude voltage of output signal φ54 of NOR gate 54 is converted from VDDI to VDDP by level conversion circuit 55 and one of output signal φ52 of inverter 52 and output signal φ55 of level conversion circuit 55 is selected by NAND gate 56 which is driven by internal power supply voltage VDDP. It is, therefore, also possible to suppress pass current which passes through NAND gate 56 to be low.

Moreover, if the DRAM is used for the TTL-system interface, output signal φ56 of NAND gate 56 is delayed by TTL-system delay circuit 57 and internal address signal A0' is generated. If the DRAM is used for the 1.8 V-system interface, output signal φ56 of NAND gate 56 is delayed by 1.8 V-system delay circuit 58 and internal address signal A0' is generated. By doing so, the difference T55–T52 between delay time T55 of level conversion circuit 55 and delay time T52 of inverter 52 is compensated. It is, therefore, possible to keep time required from external address signal A0 is inputted until internal address signal A0' is outputted, constant, whether the DRAM is used for the TTL-system interface or the 1.8 V-system interface.

Third Embodiment

Figure 15:
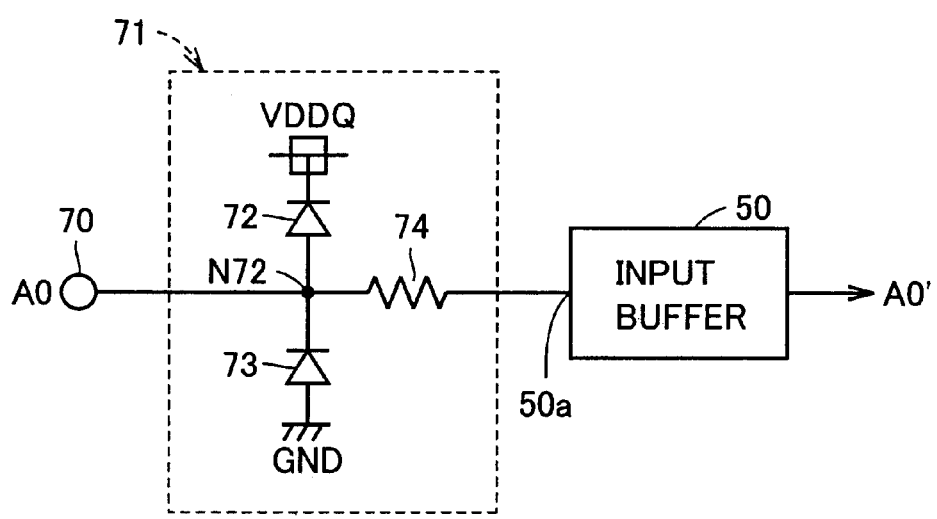
FIG. 15 is a circuit diagram showing a configuration of an input protection circuit of a DRAM according to a third embodiment of the present invention.

FIG. 15 is a circuit block diagram which shows a configuration of an input protection circuit 71 of a DRAM according to a third embodiment of the present invention. Input protection circuit 71 is provided to correspond to each external pin 70 and protects internal circuits such as input buffer 50 from a surge voltage applied to external pin 70. In FIG. 15, input protection circuit 71 which is provided to correspond to external pin 70 for inputting address signal A0 is shown.

In FIG. 15, input protection circuit 71 includes diodes 72 and 73 and a resistance element 74. Diodes 73 and 72 are connected in series between a ground potential GND line and an output power supply potential VDDQ line. A node N72 between diodes 73 and 72 is connected to external pin 70 and also connected to an input node 50a of input buffer 50 through resistance element 74.

If the threshold voltage of each of diodes 72 and 73 is set at 0.6 V and the potential of node N72 is higher than VDDQ+0.6 V, then diode 72 becomes conductive. If the threshold voltage of each of diodes 72 and 73 is set at 0.6 V and the potential of node N72 is lower than GND −0.6 V, then diode 73 becomes conductive.

For the TTL-system interface, VDDQ is 3.3 V, VIHmin is 2 V and VILmax is 0.8 V. For the 1.8 V-system interface, VDDQ is 1.8 V, VIHmin is 1.44 V and VILmax is 0.36 V. Therefore, as long as ordinary signal A0 is applied to external pin 70, diodes 72 and 73 are never become conductive and signal A0 is applied to input buffer 50 through resistance element 74.

If a surge voltage is applied to external pin 70 and the potential of node N72 is higher than VDDQ+0.6 V, then diode 72 becomes conductive. If the surge voltage is applied to external pin 70 and the potential of node N72 is lower than −0.6 V, then diode 73 becomes conductive and the surge voltage is suppressed by resistance element 74. Therefore, the potential of node N72 is restricted to a range of −0.6 V to VDDQ +0.6 V, thereby preventing input buffer 50 from being destroyed by the surge voltage.

Further, the cathode of diode 72 is connected to input power supply potential VDDQ line. Therefore, even if power supply voltage VDD is set at 0 V in a system standby state and "H" level is applied to external pin 70, no leak current is carried to diode 72 and it is possible to prevent the system from being adversely influence by the leak current.

Figure 16:
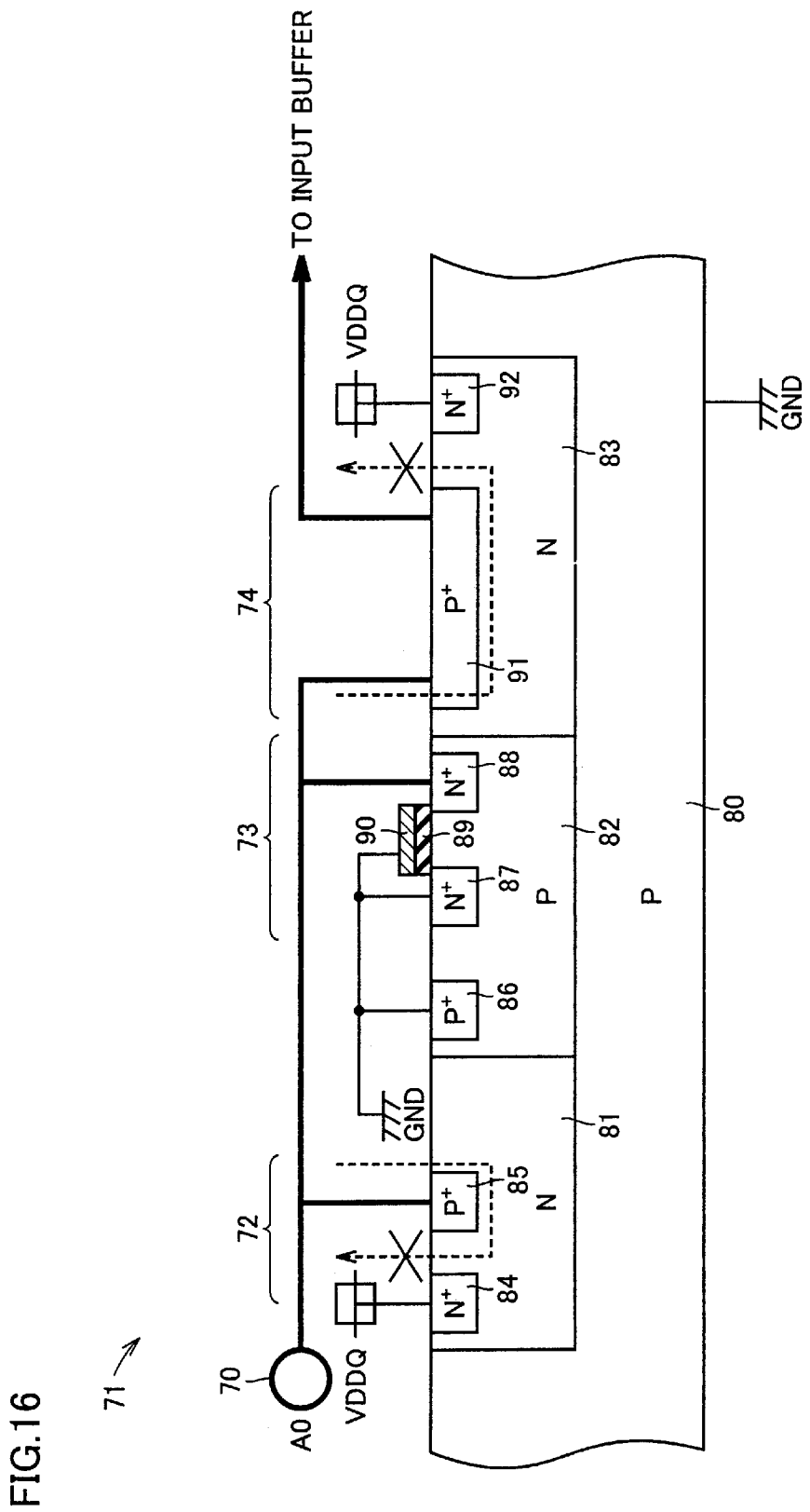
FIG. 16 is a cross-sectional view showing the configuration of the input protection circuit shown in FIG. 15.

FIG. 16 is a cross-sectional view which shows an actual configuration of input protection circuit 71 shown in FIG. 15. In FIG. 16, an N-type well 71, a P-type well 82 and an N-type well 83 are formed on the surface of a P-type silicon substrate 80. An N+-type diffused layer 84 and a P+-type diffused layer 85 are formed on the surface of N-type well 81. N+-type diffused layer 84 is connected to an output power supply potential VDDQ line and P+-type diffused layer 85 is connected to external pin 70. P+-type diffused layer 85, N-type well 81 and N+-type diffused layer 84 constitute diode 72.

A P+-type diffused layer 86, N+-type diffused layers 87 and 88 are formed on the surface of P-type well 82. Between N+-type diffused layers 87 and 88, a gate electrode 90 is formed above the surface of P-type well 82 through a gate oxide film 89. P+-type diffused layer 86, N+-type diffused layer 87 and gate electrode 90 are all connected to a ground potential GND line and N+-type diffused layer 88 is connected to external pin 70. N+-type diffused layers 87 and 88, gate oxide film 89 and gate electrode 90 constitute an N-channel MOS transistor and this N-channel MOS transistor, in turn, constitutes diode 73.

A P+-type diffused layer 91 and an N+-type diffused layer 92 are formed on the surface of N-type well 83. One end portion of P+-type diffused layer 91 is connected to external pin 70 and the other end portion thereof is connected to input buffer 50. P+-type diffused layer 91 constitutes resistance element 74. N+-type diffused layer 92 is connected to an output power supply potential VDDQ line. Output power supply potential VDDQ is applied to both N+-type diffused layers 84 and 92 to maintain PN junctions in a reverse bias state in N-type wells 81 and 83. Therefore, as long as a surge voltage is not applied to external pin 70, no current leaks from external pin 70 to the output power supply potential VDDQ line through the PN junctions in N-type wells 81 and 83.

Figure 17:
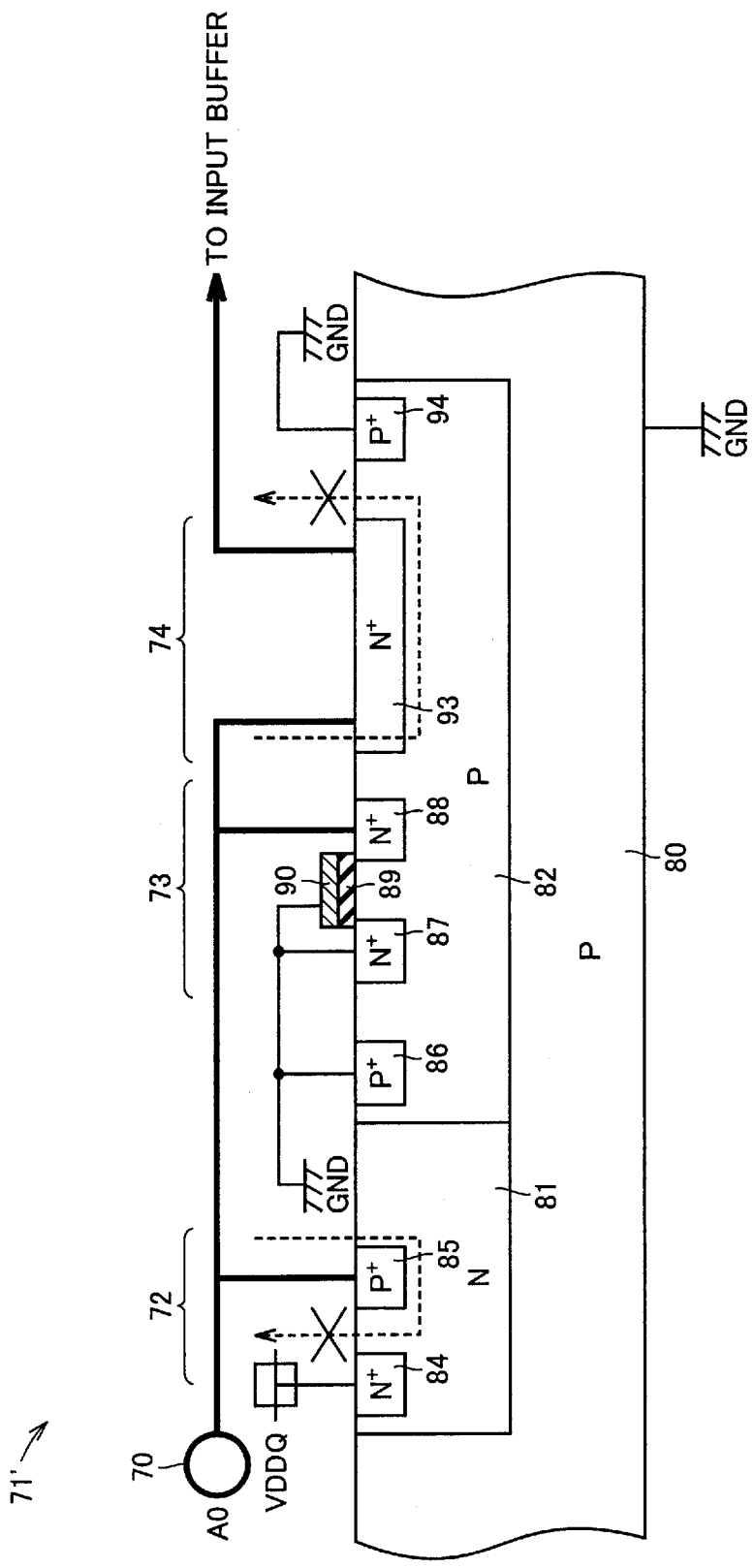
FIG. 17 is a cross-sectional view showing a modification of the third embodiment.

FIG. 17 is a cross-sectional view which shows a modification of the third embodiment. In FIG. 17, an input protection circuit 71' differs from input protection circuit 71 shown in FIG. 16 in that N-type well 83 is eliminated and an N+-type diffused layer 93 and a P+-type diffused layer 94 are formed on the surface of P-type well 82. One end portion of N+-type diffused layer 93 is connected to external pin 70 and the other end portion thereof is connected to input buffer 50. N+-type diffused layer 93 constitutes resistance element 74. P+-type diffused layer 94 is connected to a ground potential GND line. In this modification, P+-type diffused layer 93 and P-type well 82 are always in a reverse bias state relative to each other, so that no leak current is carried to resistance element 74.

Fourth Embodiment

Figure 18:
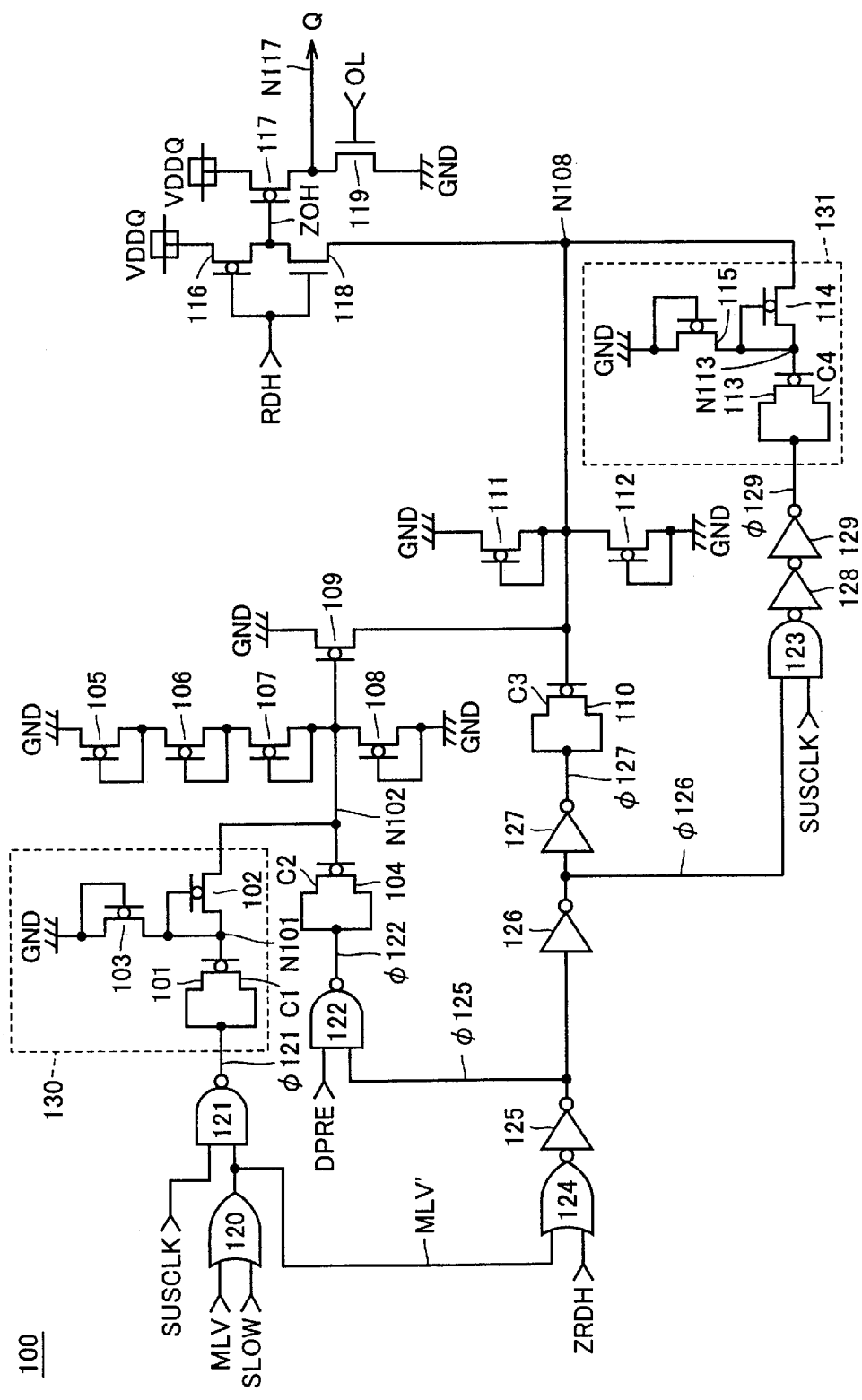
FIG. 18 is a circuit diagram showing a configuration of an output buffer of a DRAM according to a fourth embodiment of the present invention.

FIG. 18 is a circuit diagram which shows a configuration of an output buffer 100 of a DRAM according to a fourth embodiment of the present invention. Output buffer 100 is included in output circuit 6 shown in FIG. 1, and is provided to correspond to each of data signals Q0 to Qn. In FIG. 18, output buffer 100 includes P-channel MOS transistors 101 to 117, N-channel MOS transistors 118 and 119, an OR gate 120, NAND gates 121 to 123, a NOR gate 124 and inverters 125 to 129. N-channel MOS transistors 101 to 103 constitute a charge-pump circuit 130 and P-channel MOS transistors 113 to 115 constitute a charge-pump circuit 131.

P-channel MOS transistor 117 is connected between an output power supply potential VDDQ line and an output node N117 and the gate thereof receives signal ZOH. N-channel MOS transistor 119 is connected between output node N117 and a ground potential GND line and the gate thereof receives signal OL. P-channel MOS transistor 116 is connected between an output power supply potential VDDQ line and the gate of P-channel MOS transistor 117 and the gate thereof receives signal RDH. N-channel MOS transistor 118 is connected between the gate of P-channel MOS transistor 117 and a node N108 and the gate thereof receives signal RDH. A signal which appears at the node between MOS transistors 116 and 118 is signal ZOH.

If the DRAM is used for the TTL-system interface (MLV=VDDP and VDDQ=3.3 V), node N108 is set at ground potential GND. A method for setting node N108 at ground potential GND will be described later. If signals RDH and OL are at "H" level and "L" level, respectively, then MOS transistors 117 and 118 become conductive, MOS transistors 116 and 119 become nonconductive and read data signal Q is set at "H" level. If signals RDH and OL are at "L" level and "H" level, respectively, then MOS transistors 116 and 119 become conductive, MOS transistors 117 and 118 become nonconductive and read data signal Q is set at "L" level.

If the DRAM is used for the 1.8 V-system interface (MLV=0 V and VDDQ=1.8 V), node N108 is set at a negative potential VBB. A method for setting node N108 at negative potential VBB will be described later. The reason for setting node N108 at negative potential VBB if the DRAM is used for the 1.8 V-system interface is as follows. For the 1.8 V-system interface, VDDQ is set at 1.8 V. Therefore, if node N108 is set at ground potential GND, the current driving force of P-channel MOS transistor 117 becomes insufficient. The size of P-channel MOS transistor 117 and the level of negative potential VBB are set so that the current driving force of P-channel MOS transistor 117 at VDDQ=3.3 V and ZOH=GND coincides with that at VDDQ=1.8 V and ZOH=VBB.

A method for selectively setting the potential of node N108 at one of ground potential GND and negative potential VBB will next be described. In FIG. 18, OR gate 120 receives signals MLV and SLOW and outputs a signal MLV'. Signal SLOW is a signal which is set at "H" level in a slow through rate mode in which data signal Q is outputted at a relatively low rate. NOR gate 124 receives signals MLV' and ZRDH and the output signal of NOR gate 124 is connected to the source and drain of P-channel MOS transistor 110 through inverters 125 to 127. The gate of P-channel MOS transistor 110 is connected to node N108. P-channel MOS transistor 110 constitutes a capacitor C3. Signal ZRDH is a complementary signal to signal RDH.

P-channel MOS transistor 111 is connected between a ground potential GND line and node N108 and the gate thereof is connected to node N108. P-channel MOS transistor 112 is connected between node N108 and a ground potential GND line and the gate thereof is connected to the ground potential GND line. Each of P-channel MOS transistors 111 and 112 constitute a diode. If the potential of node N108 is higher than Vth (where Vth is the threshold voltage of the P-channel MOS transistor), P-channel MOS transistor 112 becomes conductive. If the potential of node N108 is lower than −Vth, P-channel MOS transistor 111 becomes conductive. Accordingly, the potential of node N108 is restricted to a range from −Vth to Vth.

P-channel MOS transistor 109 is connected between a ground potential GND line and node N108. NAND gate 122 receives an output signal $\phi$125 of inverter 125 and a signal DPRE, and an output signal $\phi$122 of NAND gate 122 is inputted into the source and drain of P-channel MOS transistor 104. The gate of P-channel MOS transistor 104 is connected to the gate of P-channel MOS transistor 109 (node N102). P-channel MOS transistor 104 constitutes a capacitor C2. Signal DPRE is a signal the level of which is raised from "L" level to "H" level in response to a read command READ (output instruction signal).

P-channel MOS transistors 105 to 107 are connected in series between a ground potential GND line and a node N102. The gates of P-channel MOS transistors 105 to 107 are connected to the drains of P-channel MOS transistors 105 to 107, respectively. P-channel MOS transistor 108 is connected between node N102 and a ground potential GND line and the gate thereof is connected to the ground potential GND line. Each of P-channel MOS transistors 105 to 108 constitutes a diode. If the potential of node N102 is higher than Vth, P-channel MOS transistor 108 becomes conductive. If the potential of node N102 is lower than −3Vth, P-channel MOS transistors 105 to 107 become conductive. Accordingly, the potential of node N102 is restricted to a range of −3Vth to Vth.

If signal MLV or SLOW is at "H" level, the level of output signal MLV' of OR gate 120 becomes "H" level. In this case, the level of output signal $\phi$125 of inverter 125 is fixed to "H" level and NAND gate 122 operates as an inverter for signal DPRE. While signal DPRE is at "L" level, output signal $\phi$122 of NAND gate 122 is set at "H" level (VDDP) and capacitor C2 is charged with VDDP −Vth. If the level of signal DPRE is raised from "L" level to "H" level, then the level of signal $\phi$122 is fallen from "H" level to "L" level, the potential of node N102 is fallen to 2Vth-VDDP by capacitive coupling, P-channel MOS transistor 109 becomes conductive and node N108 is set at ground potential GND.

If signals MLV and SLOW are both at "L" level, output signal MLV' of OR gate 120 is set at "L" level. While signal ZRDH is at "H" level, capacitor C2 is charged with VDDP−Vth while signal DPRE is kept at "L" level as described above. If the level of signal DPRE is raised to "H" level, then P-channel MOS transistor 109 becomes conductive and node N108 is set at ground potential GND. While signals ZRDH and DPRE are both at "H" level, then the level of output signal $\phi$122 of NAND gate 122 is set at "L" level (0 V), capacitor 104 is charged with −Vth, the level of output signal $\phi$127 of inverter 127 is set at "H" level (VDDP) and capacitor C3 is charged with VDDP−Vth. If the level of signal ZRDH is then fallen to "L" level, then the level of output signal 122 of NAND gate 122 is raised to "H" level (VDDP), the potential of node N102 is raised to 3Vth (<VDDP+Vth), P-channel MOS transistor 109 becomes nonconductive, output signal $\phi$127 of inverter 127 is fallen to "L" level and node N108 is set at −Vth (>Vth−VDDP).

The charge-pump circuit 130 emits positive charges from node N102 and keeps the potential of node N102 to be −3Vth while signal MLV' is at "H" level. That is, NAND gate 121 receives signals MLV' and SUSCLK, and an output signal $\phi$121 thereof is applied to the source and drain of P-channel MOS transistor 101. The gate of P-channel MOS transistor 101 (node N101) is connected to node N102 through P-channel MOS transistor 102 and also connected to a ground potential GND line through P-channel MOS transistor 103. The gate of P-channel MOS transistor 102 is connected to node N101 and that of P-channel MOS transistor 103 is connected to a ground potential GND line. P-channel MOS transistor 101 constitutes a capacitor C1 and each of P-channel MOS transistors 102 and 103 constitutes a diode.

If signal MLV' is at "H" level, NAND gate 121 operates as an inverter for clock signal SUSCLK. If the level of output signal $\phi$121 of NAND gate 121 is fallen from "H" level to "L" level, positive charges flow in node N101 from node N102 through P-channel MOS transistor 102. If the level of signal $\phi$121 is raised from "L" level to "H" level, positive charges flow in the ground potential GND line from node N 101 through P-channel MOS transistor 103. Therefore, whenever the level of signal $\phi$121 is fallen from "H" level to "L" level, the potential of node N102 lowers. If signal MLV' is at "L" level, then the level of output signal $\phi$121 of NAND gate 121 is fixed to "H" level and charge-pump circuit 130 does not operate.

The charge-pump circuit 131 emits positive charges from node N108 and keeps the potential of node N108 to be −Vth while signals MLV and ZRDH are at "L" level. That is, NAND gate 123 receives clock signal SUSCLK and output signal $\phi$126 of inverter 126, and an output signal thereof is connected to the source and drain of P-channel MOS transistor 113 through inverters 128 and 129. The gate of P-channel MOS transistor 113 (node N113) is connected to node N108 through P-channel MOS transistor 114 and also connected to a ground potential GND line through P-channel MOS transistor 115. The gate of P-channel MOS transistor 114 is connected to node N 113 and that of P-channel MOS transistor 115 is connected to a ground potential GND line. P-channel MOS transistor 113 constitutes a capacitor C4 and each of P-channel MOS transistors 114 and 115 constitutes a diode.

If signals MLV' and ZRDH are both at "L" level, the level of output signal $\phi$126 of inverter 126 is fixed to "H" level and NAND gate 123 operates as an inverter for signal SUSCLK. If the level of an output signal φ129 of inverter 129 is fallen from "H" level to "L" level, positive charges flow in node N113 from node N108 through P-channel MOS transistor 114. If the level of signal φ129 is raised from "L" level to "H" level, positive charges flow in the ground potential GND line from node N113 through P-channel MOS transistor 115. Therefore, whenever the level of signal φ129 is fallen from "H" level to "L" level, the potential of node N108 lowers. If signal MLV is at "H" level, then the level of signal φ129 is fixed to "H" level and charge-pump circuit 131 does not operate.

The operations of output buffer 100 will next be described. If the DRAM is used for the TTL-system interface (MLV=VDDP), then the level of output signal MLV' of OR gate 120 becomes "H" level, those of output signals φ125 and φ127 of inverters 125 and 127 are fixed to "H" level and output signal φ126 of inverter 126 is fixed to "L" level. Therefore, capacitors C3 and C4 are not driven and charge-pump circuit 131 does not operate.

Figure 19:
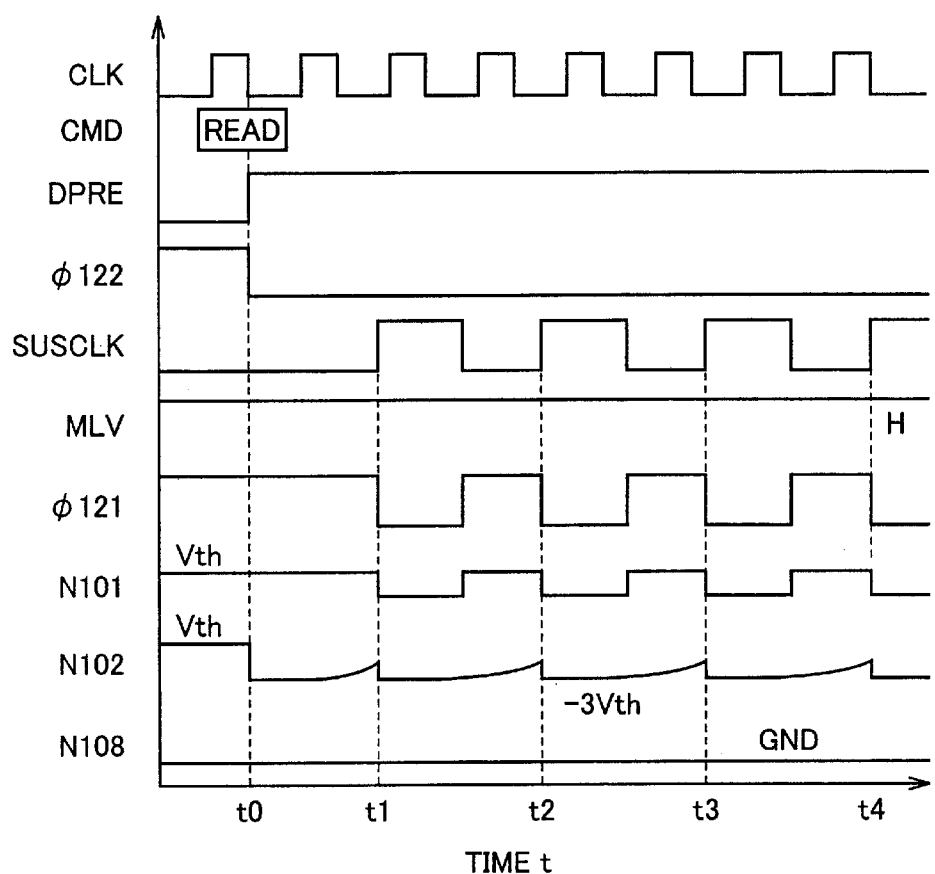
FIG. 19 is a time chart showing an operation of the output buffer shown in FIG. 18.

In FIG. 19, if read command READ is inputted synchronously with clock signal CLK at prescribed time t0, then the level of signal DPRE is raised from "L" level to "H" level, that of output signal φ122 of NAND gate 122 is fallen from "H" level to "L" level and the potential of node N102 is dropped to −3Vth. The potential of node N102 gradually rises by leak current. After the elapse of predetermined time after read command READ is inputted, clock signal SUSCLK is generated. Clock signal SUSCLK is inverted to signal φ121 by NAND gate 121. If the level of signal φ121 is lowered from "H" level to "L" level, then the potential of node N101 is lowered and that of node N102 is dropped to −3Vth. As a result, P-channel MOS transistor 109 is kept conductive and the potential of node N108 is kept to be ground potential GND.

If signal SLOW is at "H" level, the level of signal MLV' becomes "H" level irrespective of the level of signal MLV and the potential of node N108 is kept to be ground potential GND. Accordingly, if the DRAM is used for the 1.8 V-system interface, the output rate of data signal Q decreases and a slow through rate mode is thereby realized.

If the DRAM is used for the 1.8 V-system interface (MLV=0 V), then the level of output signal MLV' of OR gate 120 becomes "L" level, that of output signal 121 of NAND gate 121 is fixed to "H" level and charge-pump circuit 130 does not operate.

Figure 20:
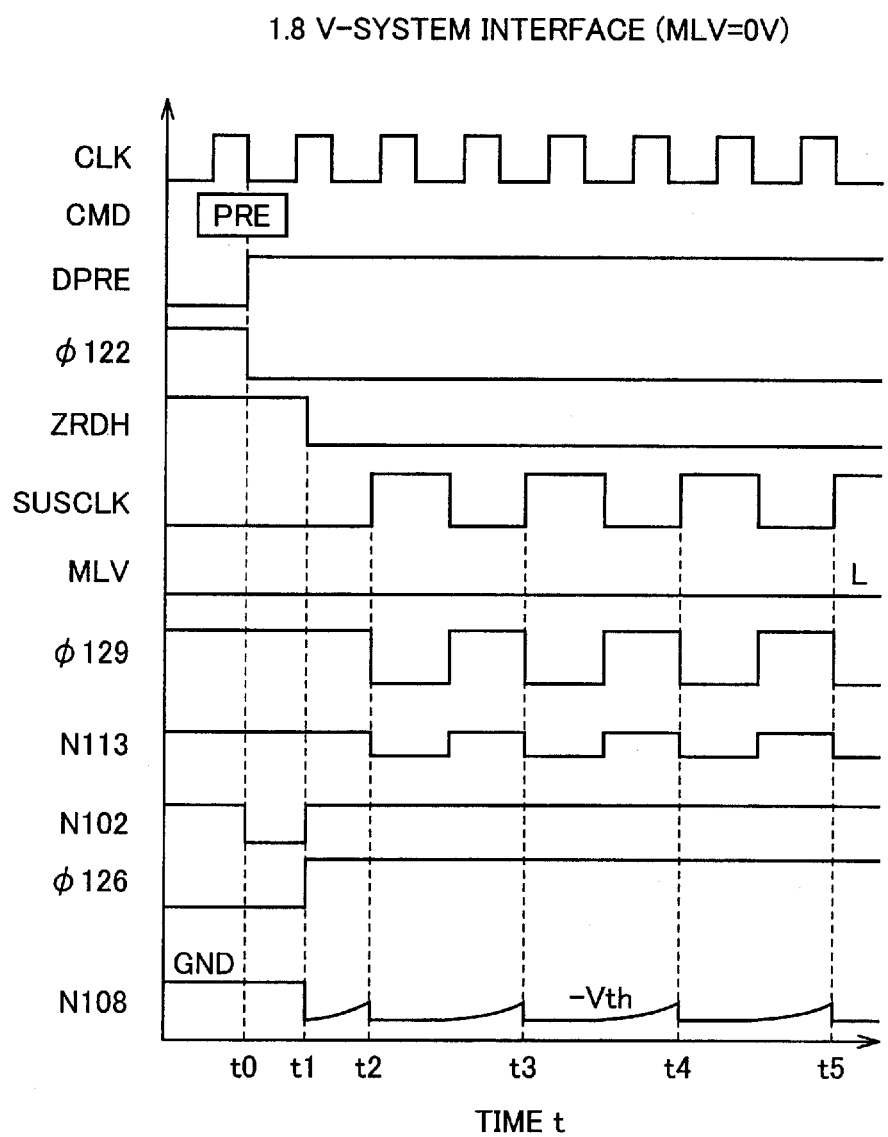
FIG. 20 is another time chart showing the operation of the output buffer shown in FIG. 18.

In FIG. 20, if read command READ is inputted synchronously with clock signal CLK at prescribed time t0, the level of signal DPRE is raised from "L" level to "H" level, that of output signal 122 of NAND gate 122 is raised from "H" level to "L" level and the potential of node N102 is dropped to −3Vth. As a result, P-channel MOS transistor 109 becomes conductive and the potential of node N108 is set at ground potential GND.

Next, if the level of internal data signal ZRDH is fallen from "H" level to "L" level at time t1, then the levels of output signals φ125 and φ127 of inverters 125 and 127 are fallen from "H" level to "L" level and that of output signal φ126 of inverter 126 is raised from "L" level to "H" level. As a result, the potential of node N102 is raised to Vth, P-channel MOS transistor 109 becomes nonconductive and the potential of node N108 is dropped to −Vth. Further, NAND gate 123 operates as an inverter for clock signal SUSCLK. After the elapse of predetermined time after read command READ is inputted, clock signal SUSCLK is generated. Clock signal SUSCLK is inverted to signal φ129 by NAND gate 123 and inverters 128 and 129. Whenever the level of signal φ129 is fallen from "H" level to "L" level, the potential of node N113 lowers and the potential of node N108 is kept to be −Vth.

In this fourth embodiment, if the DRAM is used for the TTL-system interface, ground potential GND is applied to the gate of P-channel MOS transistor 117 to make P-channel MOS transistor 117 conductive. If the DRAM is used for the 1.8 V-system interface, negative potential VBB is applied to the gate of P-channel MOS transistor 117 to make P-channel. MOS transistor 117 conductive. Therefore, by appropriately setting the size of P-channel MOS transistor 117 and the level of negative potential VBB, it is possible to set the current driving force of P-channel MOS transistor 117 at an optimum value for both the TTL-system interface and the 1.8 V-system interface.

Fifth Embodiment

Figure 21:
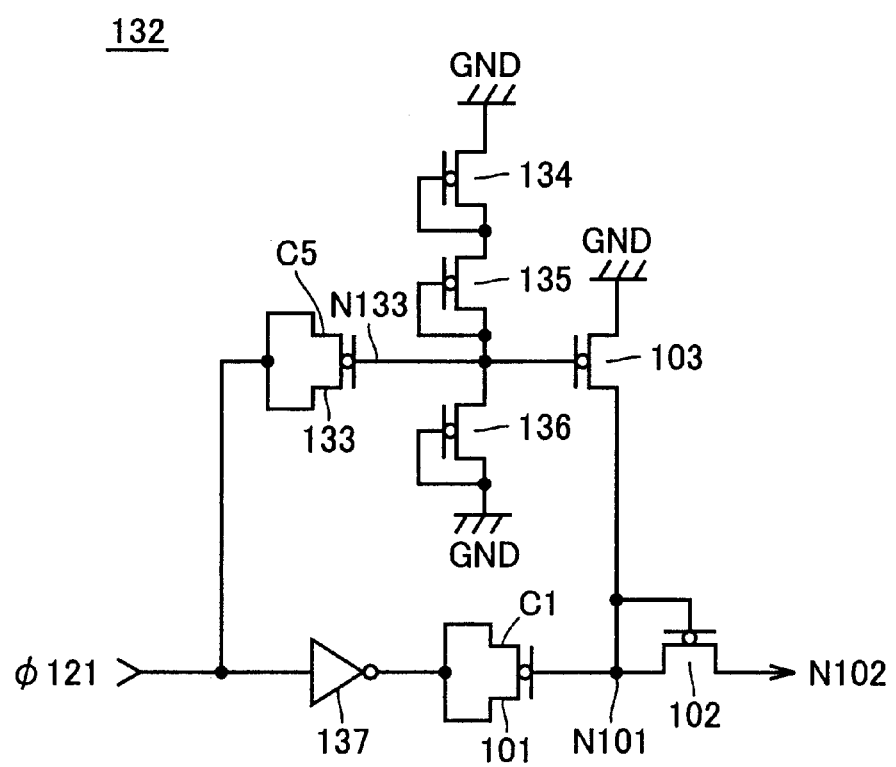
FIG. 21 is a circuit diagram showing main sections of an output buffer of a DRAM according to a fifth embodiment of the present invention.

FIG. 21 is a circuit diagram which shows main sections of an output buffer of a DRAM according to a fifth embodiment of the present invention. In FIG. 21, this output buffer differs from that shown in FIG. 18 in that at least one of charge-pump circuits 130 and 131 is replaced by a charge-pump circuit 132. FIG. 21 shows a case where charge-pump circuit 130 is replaced by charge-pump circuit 132.

Charge-pump circuit 132 is constituted so that P-channel MOS transistors 133 to 136 and an inverter 137 are added to charge-pump circuit 130. Output signal φ121 of NAND gate 121 in front of charge-pump circuit 132 is inputted into the source and drain of P-channel MOS transistor 101 through inverter 137 and also inputted into the source and drain of P-channel MOS transistor 133. The gate of P-channel MOS transistor 133 (a node N133) is connected to the gate of P-channel MOS transistor 103. P-channel MOS transistor 133 constitutes a capacitor C5.

P-channel MOS transistors 134 and 135 are connected in series between a ground potential GND line and node N133 and P-channel MOS transistor 136 is connected between node N133 and a ground potential GND line. The gates of P-channel MOS transistors 134 to 136 are connected to the drains of P-channel MOS transistors 134 to 136, respectively. Each of P-channel MOS transistors 134 to 136 constitutes a diode. If the potential of node N133 is higher than Vth, P-channel MOS transistor 136 becomes conductive. If the potential of node N133 is lower than −2Vth, P-channel MOS transistors 134 and 135 become conductive. Accordingly, the potential of node N137 is restricted to a range from −2Vth to Vth.

If the level of signal φ121 is raised from "L" level to "H" level, then the potential of node N133 is raised to Vth, P-channel MOS transistor 103 is made nonconductive, the potential of node N 101 is dropped and positive charges thereby flow in node N101 from node N102 through P-channel MOS transistor 102. If the level of signal φ121 is fallen from "H" level to "L" level, then the potential of node N133 is dropped to −2Vth, P-channel MOS transistor 103 is made conductive, the potential of node N101 is raised and positive charges thereby flow in the ground potential GND line from node N101 through P-channel MOS transistor 103. Accordingly, whenever the level of signal φ121 is raised from "L" level to "H" level, the potential of node N102 lowers.

In this fifth embodiment, P-channel MOS transistor 103 of charge-pump circuit 132 is on/off-controlled. Therefore, compared with charge-pump circuit 130 in FIG. 13 in which P-channel MOS transistor 103 is used as a diode, it is possible to efficiently emit positive charges from node N102. Accordingly, it is possible to accurately, promptly control P-channel MOS transistor 109 and to stably control the potential of node N108.

Sixth Embodiment

Figure 22:
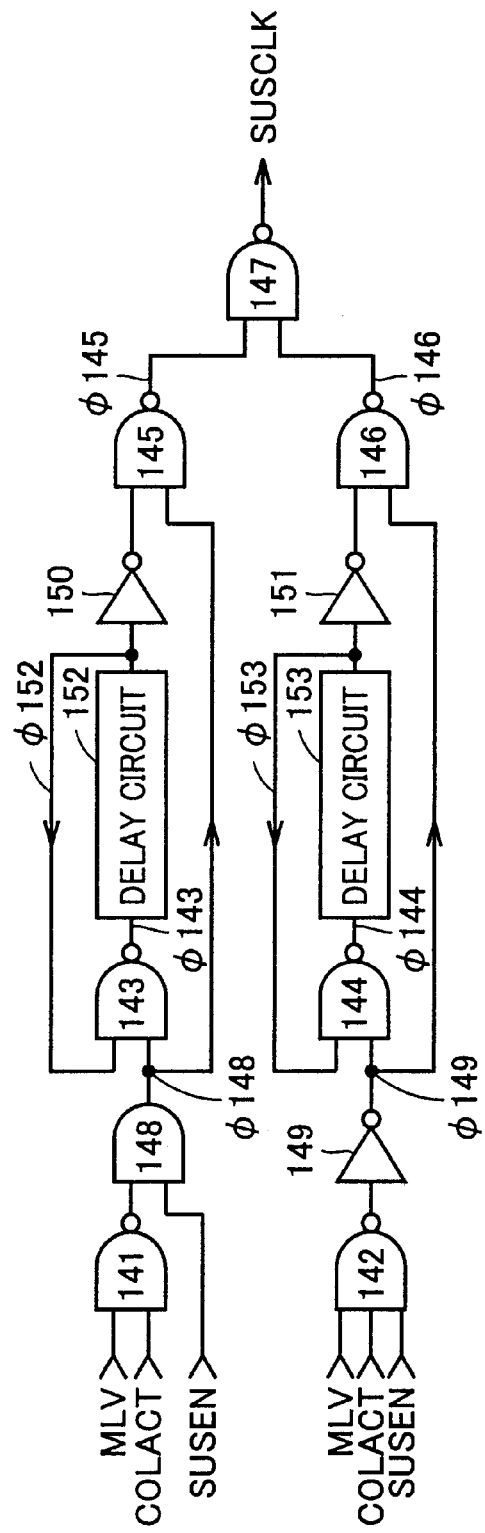
FIG. 22 is a circuit block diagram showing a configuration of a clock generation circuit of a DRAM according to a sixth embodiment of the present invention.

FIG. 22 is a circuit block diagram which shows a configuration of a clock generation circuit 140 of a DRAM according to a sixth embodiment of the present invention. In FIG. 22, this DRAM differs from that in the fourth embodiment in that the cycle of clock signal SUSCLK is switched at two stages.

That is, clock generation circuit 140 includes NAND gates 141 to 147, an AND gate 148, inverters 149 to 151 and delay circuits 152 and 153. NAND gate 141 receives signals MLV and COLACT, and AND gate 148 receives an output signal of NAND gate 141 and a signal SUSEN. Signal MLV is set at "H" level if the DRAM is used for the TTL-system interface, and set at "L" level if used for the 1.8 V-system interface. Signal COLACT is set at "H" level in an active state and set at "L" level if a precharge command PRE (standby instruction signal) is inputted. Signal SUSEN is a signal the level of which is raised from "L" level to "H" level in response to read command READ (output instruction signal).

An output signal φ148 of AND gate 148 is inputted into one input node of each of NAND gates 143 and 145. An output signal φ143 of NAND gate 143 is inputted into the other input node of NAND gate 145 through delay circuit 152 and inverter 150, and an output signal φ152 of delay circuit 152 is inputted into the other input node of NAND gate 143. Delay circuit 152 has predetermined delay time T1 (e.g., 250 ns). If output signal φ148 of AND gate 148 is set at "H" level, a ring oscillator is constituted out of NAND gate 143 and delay circuit 152.

Further, NAND gate 142 receives signals MLV, COLACT and SUSEN, and an output signal thereof is inputted into one input node of each of NAND gates 144 and 146 through inverter 149. An output signal φ144 of NAND gate 144 is inputted into the other input node of NAND gate 146 through delay circuit 153 and inverter 151, and an output signal φ153 of delay circuit 153 is inputted into the other input node of NAND gate 144. Delay circuit 153 has delay time T2 (e.g., 130 ns) shorter than delay time T1 of delay circuit 152. If an output signal φ149 of inverter 149 is set at "H" level, a ring oscillator is constituted out of NAND gate 144 and delay circuit 153. NAND gate 147 receives output signals φ145 and φ146 of NAND gates 145 and 146, respectively, and outputs clock signal SUSCLK.

Figure 23:
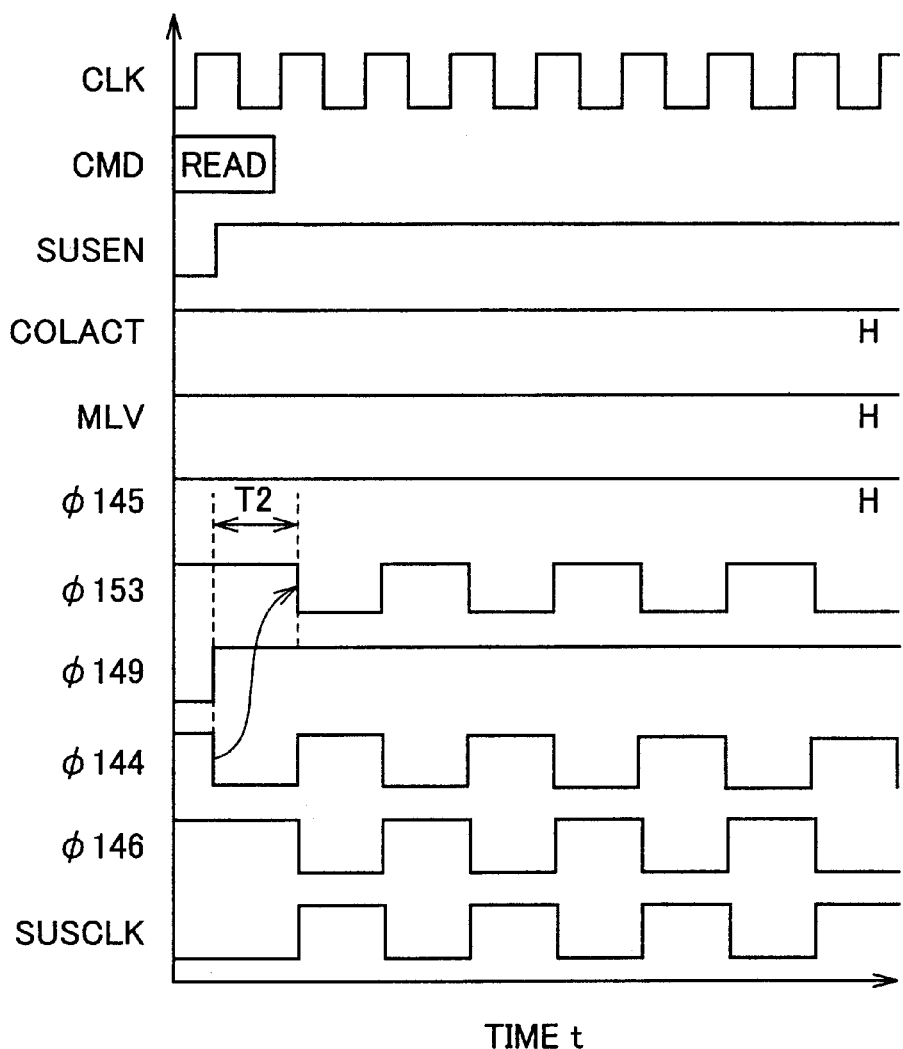
FIG. 23 is a time chart showing an operation of the clock generation circuit shown in FIG. 22.

The operations of this DRAM will next be described. If the DRAM is used for the TTL-system interface, signal MLV is set at "H" level as shown in FIG. 23. Signal COLACT is set at "H" level in response to an active command ACT which is inputted in advance. In FIG. 23, in an initial state, signal SUSEN is set at "L" level and the levels of signals φ148 and φ149 are fixed to "L" level, those of signals φ145 and φ146 are fixed to "H" level, and that of clock signal SUSCLK is fixed to "L" level.

If read command READ is inputted synchronously with clock signal CLK at prescribed time, then the level of signal SUSEN is raised from "L" level to "H" level and that of signal φ149 is raised from "L" level to "H" level. As a result, a ring oscillator is constituted out of NAND gate 144 and delay circuit 153, output signal φ153 of delay circuit 153 becomes a clock signal the logical level of which is inverted at intervals of delay time T2. Clock signal φ153 is inverted to clock signal SUSCLK by inverter 151 and NAND gates 146 and 147.

Figure 24:
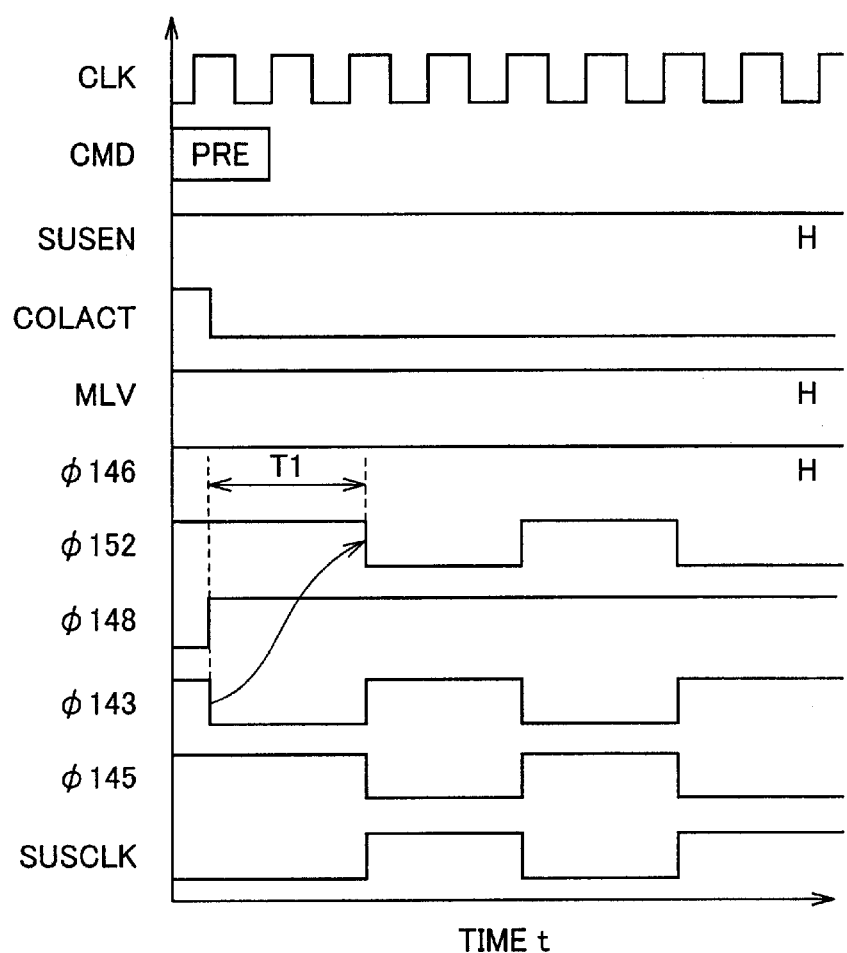
FIG. 24 is another time chart showing the operation of the clock generation circuit shown in FIG. 22.

If precharge command PRE is next inputted, then the level of signal COLACT is fallen from "H" level to "L" level, that of signal φ149 is fallen to "L" level, those of output signals φ144 and φ146 of NAND gates 144 and 146 are fixed to "H" level, respectively, and that of signal φ148 is raised to "H" level as shown in FIG. 24. As a result, a ring oscillator is constituted out of NAND gate 143 and delay circuit 152 and output signal 4152 of delay circuit 152 becomes a clock signal the logical level of which is inverted at intervals of delay time Ti. Clock signal φ152 is inverted to clock signal SUSCLK by inverter 150 and NAND gates 145 and 147.

If the DRAM is used for the 1.8 V-system interface, signal MLV is set at "L" level. Accordingly, signal SUSEN is set at "H" level, signal φ148 is set at "H" level and signal φ149 is set at "L" level irrespective of signal COLACT. As a result, clock signal SUSCLK becomes a clock signal the logical level of which is inverted at intervals of delay time T1 and the cycle of clock signal SUSCLK has no change even if precharge command PRE is inputted.

Figure 25:
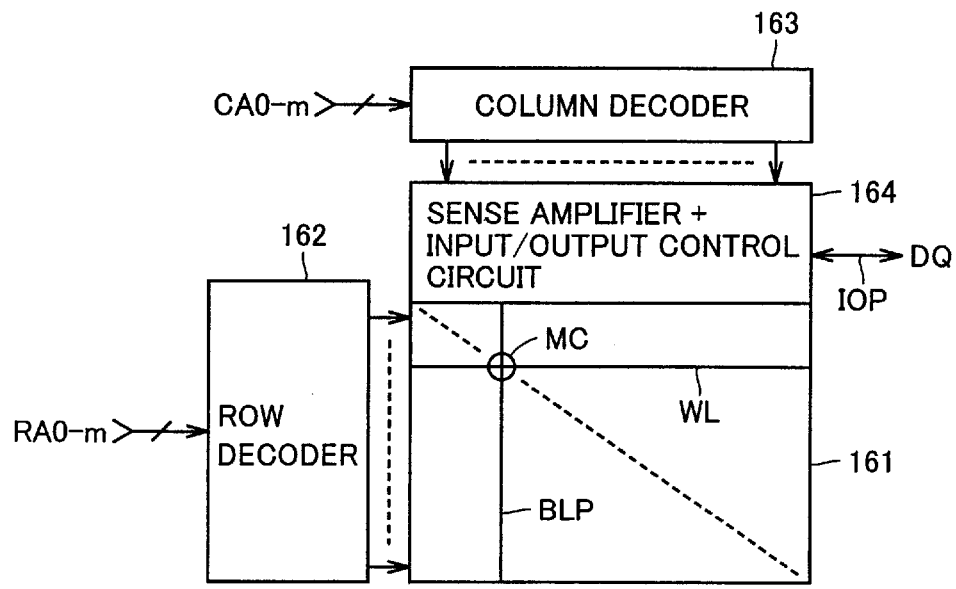
FIG. 25 is a block diagram showing main sections of the DRAM described with reference to FIGS. 22 to 24.

A command CMD in the DRAM will be complementarily described. Command CMD is inputted according to a combination of the logical levels of control signals CTN0 to CNTi shown in FIG. 1. As shown in FIG. 25, internal circuit 5 includes a memory array 161, a row decoder 162, a column decoder 163 and a sense amplifier+input/output control circuit 164.

Memory array 161 includes a plurality of memory cells MC which are arranged in a plurality of rows and columns, a plurality of word lines WL which are provided to correspond to the plurality of rows, respectively, and a plurality of bit line pairs BLP which are provided to correspond to the plurality of columns, respectively. One memory cell MC stores one data signal.

Row decoder 162 selects one word line WL from among the plurality of word lines WL in accordance with row address signals RA0 to RAm, sets selected word line WL at "H" level and activates respective memory cells MC which correspond to selected word line WL.

Column decoder 163 selects one bit line pair BLP from among the plurality of bit line pairs BLP in accordance with column address signals CA0 to CAm. Sense amplifier+input/output control circuit 164 amplifies a micro-potential difference which generates to each bit line pair BLP in response to the activation of memory cells MC, and connects bit line pair BLP which is selected by column decoder 163 to a data input/output line pair IOP. Data input/output line pair IOP is connected to input circuit 4 and output circuit 6 shown in FIG. 1.

During a read operation, active command ACT is first inputted. If active command ACT is inputted, external address signals A0 to Am which are applied at the time of input of active command ACT are incorporated as row address signals RA0 to RAm and applied to row decoder 162. Row decoder 162 sets word lines WL in a row according to row address signals RAO to RAm, at "H" level, and activates respective memory cells MC in the row. In addition, sense amplifier+input/output control circuit 164 amplifies the potential difference of each bit line pair BLP.

If read command READ is inputted next, external address signals AO to Am applied at the time of input of read command READ are incorporated as column address signals CA0 to CAm and applied to column decoder 163. Column decoder 163 selects bit line pair BLP in a column according to column address signals CA0 to CAm, and sense amplifier+input/output control circuit 164 connects selected bit line pair BLP to data input/output line pair IOP. The difference of bit line pair BLP is applied, as read data signal Q, to output circuit 6 and outputted to the outside by output circuit 6.

If precharge command PRE is inputted next, row decoder 162 and column decoder 163 finish their respective select operations and memory cells MC are deactivated.

During a write operation, active command ACT and precharge command PRE are inputted same as in the case of the read operation. In addition, a write command WRITE is inputted instead of read command READ. If write command WRITE is inputted, external address signals A0 to Am applied at the time of the input of write command WRITE are incorporated as column address signals CA0 to CAm and applied to column decoder 163. Column decoder 163 selects bit line pair BLP in a column according to column address signals CA0 to CAm, and sense amplifier+input/output control circuit 164 connects selected bit line pair BLP to data input/output line pair IOP. A data signal D which is applied through input circuit 4 is written to memory cells MC which is activated through data input line pair IOP and selected bit line pair BLP.

In this sixth embodiment, if the DRAM is used for the TTL-system interface, the cycle of clock signal SUSCLK is shortened in an active period and lengthened in a precharge period. Further, if the DRAM is used for the 1.8 V-system interface, the cycle of clock signal SUSCLK is prolonged in the both active and precharge periods. Accordingly, if the DRAM is used for the TTL-system interface, it is possible to decrease power consumption in the precharge period and if the DRAM is used for the 1.8 V-system interface, it is possible to decrease power consumption in both the active and precharge periods.

Seventh Embodiment

Figure 26:
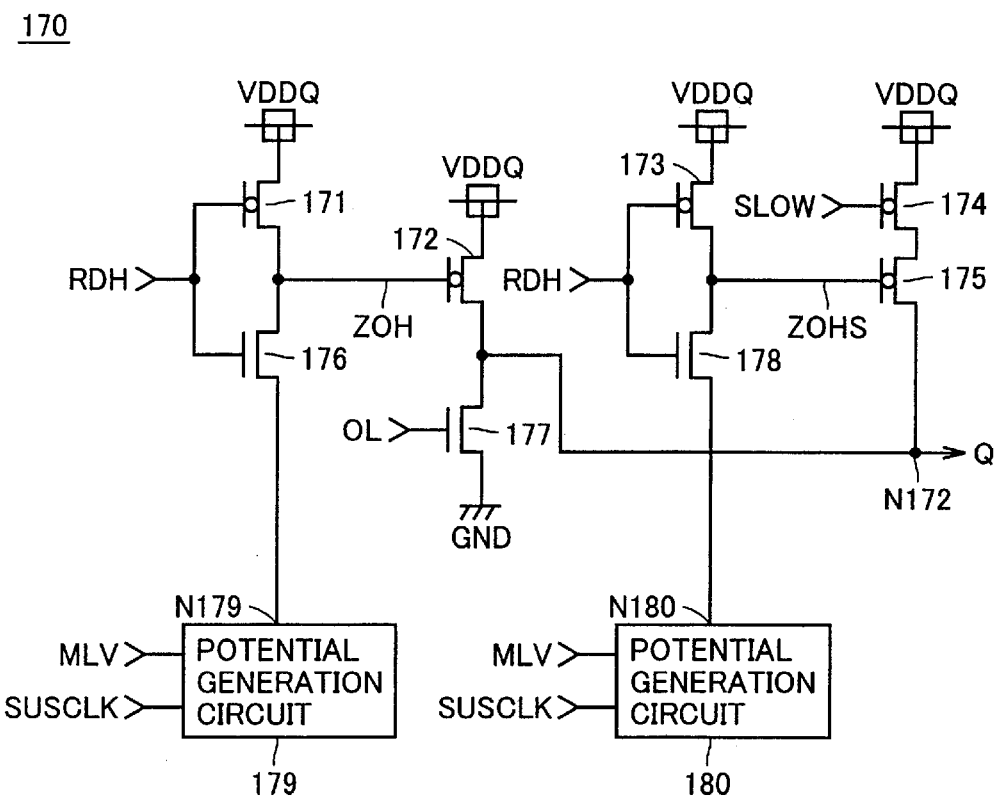
FIG. 26 is a circuit block diagram showing a configuration of an output buffer of a DRAM according to a seventh embodiment of the present invention.
Figure 30:
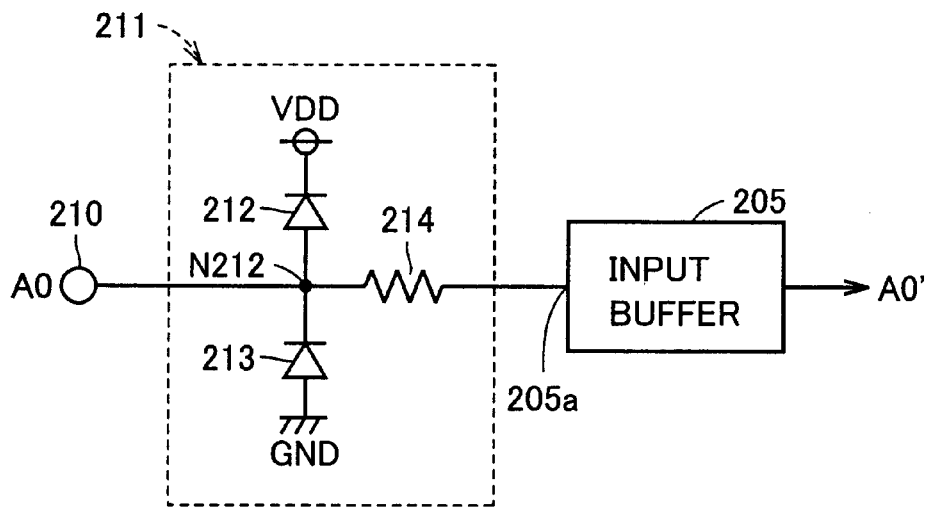
FIG. 30 is a circuit diagram showing a configuration of an input protection circuit of the conventional DRAM.
Figure 31:
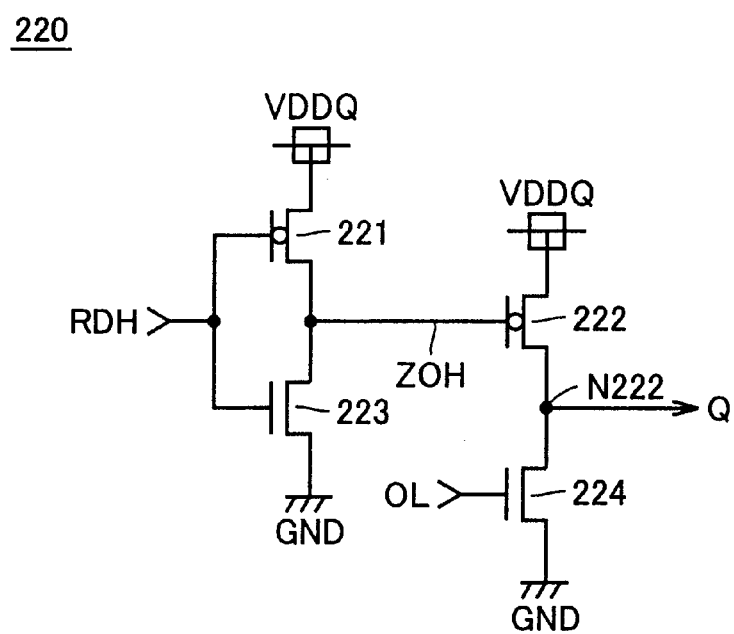
FIG. 31 is a circuit diagram showing a configuration of an output buffer of the conventional DRAM.

FIG. 26 is a circuit block diagram which shows a configuration of an output buffer 174 of a DRAM according to a seventh embodiment of the present invention. In FIG. 26, output buffer 170 includes P-channel MOS transistors 171 to 175, N-channel MOS transistors 176 to 178 and potential generation circuits 179 and 180. P-channel MOS transistor 171 and N-channel MOS transistor 176 are connected in series between an output power supply potential VDDQ line and an output node N179 of potential generation circuit 179, and the gates thereof receive internal data signal RDH. Potential generation circuit 179 is driven by clock signal SUSCLK, sets the potential of output node N179 at ground potential GND if signal MLV is at "H" level, and sets that of output node N179 at negative potential VBB if signal MLV is at "L" level.

P-channel MOS transistor 172 is connected between an output power supply potential VDDQ line and an output node N172 of output buffer 170 and the gate thereof receives signal ZOH which appears at a node between MOS transistors 171 and 176. N-channel MOS transistor 177 is connected between output node 172 and a ground potential GND line and the gate thereof receives signal OL.

P-channel MOS transistor 173 and N-channel MOS transistor 178 are connected between an output power supply potential VDDQ line and an output node N 180 of potential generation circuit 180, and the gates thereof receive internal data signal RDH. Potential generation circuit 180 is driven by clock signal SUSCLK, sets the potential of output node N180 at ground potential GND if signal MLV is at "H" level and sets that of output node N180 at negative potential VBB if signal MLV is at "L" level. P-channel MOS transistors 174 and 175 are connected in series between an output power supply potential VDDQ line and output node N172 of output buffer 170, and P-channel MOS transistors 174 and 175 receive signals SLOW and ZOHS, respectively. Signal ZOHS is a signal which appears at a node between MOS transistors 173 and 178.

If the DRAM is used for the TTL-system interface, for example, the potentials of nodes N179 and N180 are both set at ground potential GND. At an ordinary through rate, signal SLOW is set at "L" level and P-channel MOS transistor 174 becomes conductive. If signals RDH and OL are set at "H" level and "L" level, respectively, then MOS transistors 172, 175, 176 and 178 become conductive, MOS transistors 171, 173 and 177 become nonconductive and data signal Q is set at "H" level.

At a slow through rate, signal SLOW is set at "H" level and P-channel MOS transistor 174 becomes nonconductive. If P-channel MOS transistor 174 becomes nonconductive, no current is carried to P-channel MOS transistor 175. That is, P-channel MOS transistor 174 also becomes nonconductive. If signals RDH and OL are set at "H" level and "L" level, respectively, then MOS transistors 172, 176 and 178 become conductive, MOS transistors 171, 173 and 177 become nonconductive, no current is carried to P-channel MOS transistor 175 and the level of output node N172 is raised to "H" level only by the current which flows in P-channel MOS transistor 172. Accordingly, compared with the ordinary through rate at which the level of output node N 172 is raised to "H" level by the currents flowing in P-channel MOS transistors 172 and 175, the output rate of data signal Q is decreased. Consequently, a slow through rate mode is realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a first mode in which said semiconductor device is driven by a first power supply voltage and receives a first signal having an amplitude voltage lower than said first power supply voltage, and a second mode in which said semiconductor device is driven by a second power supply voltage lower than said first power supply voltage and receives a second signal having a second amplitude voltage lower than said second power supply voltage, said semiconductor device comprising:

a first logic circuit activated in said first mode to be driven by a first internal power supply voltage equal in level to said second power supply voltage, detecting whether said first signal is higher in level than a first threshold voltage, and outputting a signal of level according to a detection result;

a second logic circuit activated in said second mode to be driven by a second internal power supply voltage lower than said first internal power supply voltage, detecting whether said second signal is higher in level than a second threshold voltage, and outputting a signal of level according to a detection result; and an internal circuit performing a predetermined operation in response to output signals of said first and second logic circuits.

2. The semiconductor device according to claim 1, further comprising:

a third logic circuit driven by said second internal power supply voltage to receive the output signals of said first and second logic circuits, applying the output signal of said first logic circuit to said internal circuit in said first mode, and applying the output signal of said second logic circuit to said internal circuit in said second mode.

3. The semiconductor device according to claim 1, further comprising:

an amplitude conversion circuit converting an amplitude voltage of the output signal of said second logic circuit into said first internal power supply voltage; and a third logic circuit driven by said first internal power supply voltage to receive the output signal of said first logic circuit and an output signal of said amplitude conversion circuit, applying the output signal of said first logic circuit to said internal circuit in said first mode, and applying the output signal of said amplitude conversion circuit to said internal circuit in said second mode.

4. The semiconductor device according to claim 3, further comprising:

a first delay circuit having first delay time, and delaying an output signal of said third logic circuit to apply the delayed output signal to said internal circuit in said first mode; and a second delay circuit having second delay time shorter than said first delay time by as much as delay time of said amplitude conversion circuit, and delaying the output signal of said third logic circuit to apply the delayed output signal to said internal circuit in said second mode.

5. The semiconductor device according to claim 1, further comprising:

a first voltage generation circuit generating said first internal power supply voltage; and a second voltage generation circuit generating said second internal power supply voltage.

6. The semiconductor device according to claim 1, wherein said semiconductor device further receives a first output power supply voltage in said first mode, and receives a second output power supply voltage lower than said second power supply voltage in said second mode, said semiconductor device further comprises:

a voltage generation circuit generating said first internal power supply voltage; and an output circuit driven by said first and second output power supply voltages, and outputting a signal generated in said internal circuit to an outside of said semiconductor device, and said second output power supply voltage is also used as said second internal power supply voltage.

7. The semiconductor device according to claim 2, further comprising:

a first voltage generation circuit generating said first internal power supply voltage in said first and second modes;

a second voltage generation circuit generating said second internal power supply voltage in said second mode; and a switching element connected between output nodes of said first and second voltage generation circuits, and becoming conductive in said first mode, wherein said third logic circuit is driven by said first internal power supply voltage in said first mode.

8. The semiconductor device according to claim 1, wherein said semiconductor device further receives an output power supply voltage, and said semiconductor device further comprises:

an external terminal receiving said first and second signals;

a protection circuit including a diode element connected between said external terminal and a line of said output power supply voltage, and a resistance element connected between said external terminal and an input node of said first and second logic circuits, and protecting said first and second logic circuits from a surge voltage applied to said external terminal; and an output circuit driven by said output power supply voltage, and outputting a signal generated in said internal circuit to an outside of said semiconductor device.

9. The semiconductor device according to claim 8, wherein said resistance element is formed by an N-type diffused layer formed on a surface of a P-type well receiving a reference voltage.

10. A semiconductor device having a first mode in which said semiconductor device receives a first output power supply voltage, and a second mode in which said semiconductor device receives a second output power supply voltage lower than said first output power supply voltage, said semiconductor device comprising:

an internal circuit performing a predetermined operation; and an output circuit driven by said first and second output power supply voltages, and outputting a signal generated in said internal circuit to an outside of said semiconductor device, wherein said output circuit includes:

a first P-type transistor having a first electrode receiving said first and second output power supply voltages, and a second electrode connected to an output node;

a voltage supply circuit outputting a ground voltage in said first mode, and outputting a predetermined negative voltage in said second mode; and a switching element having one electrode connected to a gate electrode of said first P-type transistor and the other electrode receiving an output voltage of said voltage supply circuit, and become conductive or nonconductive according to the signal generated in said internal circuit.

11. The semiconductor device according to claim 10, wherein said voltage supply circuit includes:

a second P-type transistor connected between a line of said ground voltage and the other electrode of said switching element;

a first capacitor having one electrode connected to a gate electrode of said second P-type transistor;

a second capacitor having one electrode connected to the other electrode of said switching element; and a driving circuit falling a voltage of the other electrode of said first capacitor by a power supply voltage in response to an output instruction signal instructing signal output to make said second P-type transistor conductive in said first mode, and falling a voltage of the other electrode of said second capacitor by said power supply voltage in response to said output instruction signal to drop a voltage of the other electrode of said switching element in said second mode.

12. The semiconductor device according to claim 11, wherein in said second mode, said driving circuit falls the voltage of the other electrode of said first capacitor by said power supply voltage in response to said output instruction signal to make said second P-type transistor conductive, rising the voltage of the other electrode of said first capacitor by said power supply voltage after elapse of predetermined time after said output instruction signal is inputted to make said second P-type transistor nonconductive, and falling the voltage of the other electrode of said second capacitor by said power supply voltage to drop the voltage of the other electrode of said switching element.

13. The semiconductor device according to claim 11, wherein
said voltage supply circuit further includes:
a first charge-pump circuit activated in response to said output instruction signal in said first mode, and emitting positive charges from the one electrode of said first capacitor; and
a second charge-pump circuit activated in response to said output instruction signal in said second mode, and emitting positive charges from the one electrode of said second capacitor.

14. The semiconductor device according to claim 13, further comprising:
a clock generation circuit generating a first clock signal having a first cycle in response to said output instruction signal and generating a second clock signal having a second cycle longer than said first cycle in response to a standby instruction signal for instructing stopping of signal output and entering a standby state in said first mode, and generating said second clock signal in response to said output instruction signal in said second mode, wherein
said first and second charge-pump circuits are driven by first and second clock signals generated in said clock generation circuit.

15. The semiconductor device according to claim 10, wherein
said semiconductor device further has a slow through rate mode in which said semiconductor device outputs a signal at a relatively low rate, and
said voltage supply circuit outputs said ground voltage even in said second mode, in said slow through rate mode.

16. The semiconductor device according to claim 10, wherein
said semiconductor device further has a slow through rate mode in which said semiconductor device outputs a signal at a relatively low rate,
at least two sets of said first P-type transistors and at least two sets of said switching elements are provided, and
said output circuit further includes a through rate setting circuit fixing at least one first P-type transistor to a nonconductive state and lowering a through rate in the slow through rate mode.

* * * * *